US012787292B2

(12) United States Patent
Shioda et al.

(10) Patent No.: US 12,787,292 B2
(45) Date of Patent: Nov. 3, 2026

(54) SEMICONDUCTOR STORAGE ELEMENT AND MANUFACTURING METHOD THEREOF

(71) Applicant: Kioxia Corporation, Tokyo (JP)

(72) Inventors: Tomonari Shioda, Nagoya (JP); Saori Matsushita, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 376 days.

(21) Appl. No.: 18/536,799

(22) Filed: Dec. 12, 2023

(65) Prior Publication Data

US 2024/0206178 A1 Jun. 20, 2024

(30) Foreign Application Priority Data

Dec. 20, 2022 (JP) ................................ 2022-203628

(51) Int. Cl.
*H10B 43/30* (2023.01)
*H10B 43/27* (2023.01)

(52) U.S. Cl.
CPC ............ *H10B 43/30* (2023.02); *H10B 43/27* (2023.02)

(58) Field of Classification Search
CPC ........ H10B 43/30; H10B 43/27; H10B 12/00; H10B 41/27; H10B 43/35; H10B 41/35; H10B 43/00
See application file for complete search history.

(56) References Cited

U.S. PATENT DOCUMENTS

| | | | | |
|---|---|---|---|---|
| 6,975,019 | B2 | 12/2005 | Hazama | |
| 10,741,383 | B2 | 8/2020 | Noguchi et al. | |
| 11,631,694 | B2 * | 4/2023 | Noguchi | H10B 43/27 438/268 |
| 2021/0083128 | A1 | 3/2021 | Noguchi et al. | |
| 2021/0272979 | A1 | 9/2021 | Noguchi et al. | |
| 2022/0302139 | A1 * | 9/2022 | Niguchi | H10B 41/27 |

FOREIGN PATENT DOCUMENTS

| | | | | |
|---|---|---|---|---|
| CN | 116487331 | A * | 7/2023 | H10D 84/85 |
| JP | H07-321237 | A | 12/1995 | |
| JP | H11-87712 | A | 3/1999 | |

(Continued)

OTHER PUBLICATIONS

CN-116487331-A Machine Translation (Year: 2023).*

*Primary Examiner* — Eduardo A Rodela
(74) *Attorney, Agent, or Firm* — Oblon, McClelland, Maier & Neustadt, L.L.P.

(57) ABSTRACT

A semiconductor storage element according to the present embodiment includes a laminated body, a semiconductor layer, a first insulator, a second insulator, a third insulator, and a fourth insulator. In the laminated body, the insulating layers and conductive layers are alternately laminated in a first direction. The third insulator is disposed between the laminated body and the second insulator. A first part of the fourth insulator is disposed between each of the conductive layers and the third insulator. The average concentration of deuterium in the first part is higher than the average concentration of deuterium in the third insulator. The ratio of deuterium concentration to light hydrogen concentration in the first part is smaller than the ratio of deuterium concentration to light hydrogen concentration in the third insulator.

6 Claims, 20 Drawing Sheets

(56) References Cited

FOREIGN PATENT DOCUMENTS

| | | | |
|---|---|---|---|
| JP | 2004-158626 | A | 6/2004 |
| JP | 3723173 | B2 | 12/2005 |
| JP | 2019-102530 | A | 6/2019 |
| JP | 2021-44486 | A | 3/2021 |
| JP | 2021-136410 | A | 9/2021 |
| JP | 2022-144969 | A | 10/2022 |

* cited by examiner

SEMICONDUCTOR STORAGE ELEMENT AND MANUFACTURING METHOD THEREOF

CROSS REFERENCE TO RELATED APPLICATIONS

This application is based upon and claims the benefit of priority from the prior Japanese Patent Application No. 2022-203628, filed on Dec. 20, 2022, the entire contents of which are incorporated herein by reference.

FIELD

The embodiments of the present invention relate to a semiconductor storage element and a manufacturing method thereof.

BACKGROUND

A NAND flash memory in which memory cells are three-dimensionally disposed is known as a semiconductor storage device. In the NAND flash memory, a laminated body in which a plurality of electrode layers and insulating layers are alternately laminated is provided with a memory hole penetrating through the laminated body. A block insulator, an electric charge accumulation film, a tunnel insulator, and a semiconductor layer (channel layer) are provided in the memory hole to form a memory string in which a plurality of memory cells are connected in series. Data is stored in the memory cells by controlling the amount of electric charge held in the electric charge accumulation film.

DETAILED DESCRIPTION

Figure 1:
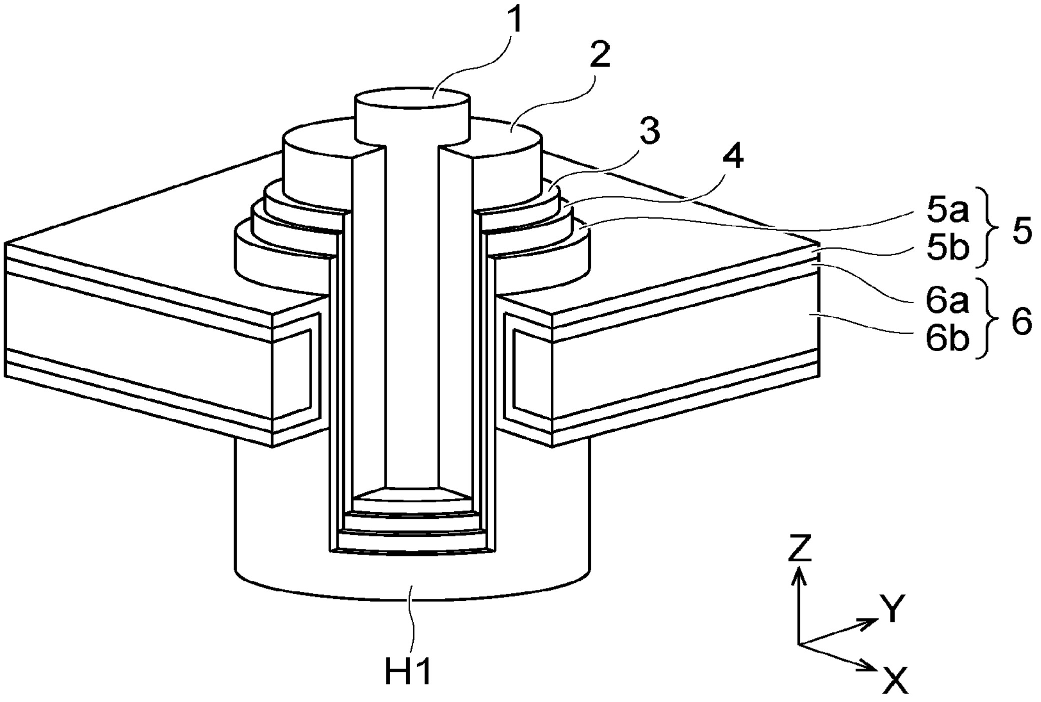
FIG. 1 is a perspective view illustrating the structure of a semiconductor storage element of a first embodiment.

Embodiments will now be explained with reference to the accompanying drawings. The present invention is not limited to the embodiments. It should be noted that the drawings are schematic or conceptual, and the relationship between the thickness and the width in each element and the ratio among the dimensions of elements do not necessarily match the actual ones. Even if two or more drawings show the same portion, the dimensions and the ratio of the portion may differ in each drawing. In the present specification and the drawings, elements identical to those described in the foregoing drawings are denoted by like reference characters and detailed explanations thereof are omitted as appropriate.

A semiconductor storage element according to the present embodiment includes a laminated body, a semiconductor layer, a first insulator, a second insulator, a third insulator, and a fourth insulator. In the laminated body, the insulating layers and conductive layers are alternately laminated in a first direction. The semiconductor layer is disposed in a first direction in the laminated body. The first insulator is disposed in the first direction between the laminated body and the semiconductor layer. The second insulator is disposed in the first direction between the laminated body and the first insulator. The third insulator is disposed in the first direction between the laminated body and the second insulator. The fourth insulator includes a first part and a second part. The first part is disposed between each of the conductive layers and the third insulator, and the second part is disposed in a second direction intersecting the first direction between each of the conductive layers and the insulating layer and is connected to the first part. The average concentration of deuterium in the first part is higher than the average concentration of deuterium in the third insulator. The ratio of deuterium concentration to light hydrogen concentration in the first part is smaller than the ratio of deuterium concentration to light hydrogen concentration in the third insulator.

First Embodiment

FIG. 1 is a perspective view illustrating the structure of a semiconductor storage element of a first embodiment. The semiconductor storage element in FIG. 1 is, for example, a three-dimensional NAND memory.

The semiconductor storage element in FIG. 1 includes a core insulator 1, a channel semiconductor layer 2, a tunnel insulator 3, an electric charge accumulation film 4, a block insulator 5, and an electrode layer 6. The block insulator 5 includes an insulator 5*a* and an insulator 5*b*. The electrode layer 6 includes a barrier metal layer 6*a* and an electrode material layer 6*b*. The tunnel insulator 3, the electric charge accumulation film 4, and the block insulator 5 are also referred to as a cell multilayer film.

In the semiconductor storage element of the present embodiment, a plurality of electrode layers and a plurality of insulating layers are alternately laminated on a substrate, and a memory hole H1 is provided in the electrode layers and the insulating layers. FIG. 1 illustrates the electrode layer 6 as one of the electrode layers. The electrode layers function as, for example, word lines of a NAND memory. FIG. 1 illustrates an X direction and a Y direction parallel to the surface of the substrate and orthogonal to each other, and a Z direction orthogonal to the surface of the substrate. In the present specification, the positive Z direction is treated as the upward direction, and the negative Z direction is treated as the downward direction. The negative Z direction may be or may not be aligned with the direction of gravity.

The core insulator 1, the channel semiconductor layer 2, the tunnel insulator 3, the electric charge accumulation film 4, and the insulator 5*a* are formed in the memory hole H1 and constitute a memory cell of a NAND memory. The insulator 5*a* is formed on the surfaces of the electrode layers and the insulating layers in the memory hole H1, and the electric charge accumulation film 4 is formed on the surface of the insulator 5*a*. The electric charge accumulation film 4 can accumulate electric charge between an outer side surface and an inner side surface. The tunnel insulator 3 is formed on the surface of the electric charge accumulation film 4, and the channel semiconductor layer 2 is formed on the surface of the tunnel insulator 3. The channel semiconductor layer 2 functions as a channel of the memory cell. The core insulator 1 is formed in the channel semiconductor layer 2.

The insulator 5*a* is, for example, a SiO film (silicon oxide film). The electric charge accumulation film 4 is, for example, a SiN film (silicon nitride film). The tunnel insulator 3 is, for example, a SiON film (silicon oxynitride film). The channel semiconductor layer 2 is, for example, a polysilicon layer. The core insulator 1 is, for example, a silicon oxide film.

The insulator 5*b*, the barrier metal layer 6*a*, and the electrode material layer 6*b* are formed between insulating layers adjacent to each other and sequentially formed on the lower surface of the upper insulating layer, the upper surface of the lower insulating layer, and the side surface of the insulator 5*a*. The insulator 5*b* is, for example, a metal insulator made of aluminum oxide or the like. The barrier metal layer 6*a* is, for example, a titanium nitride film. The electrode material layer 6*b* is, for example, a W (tungsten) layer.

FIGS. 2 to 5 and 10 are cross-sectional views illustrating a method of manufacturing the semiconductor storage element of the first embodiment.

Figure 2:
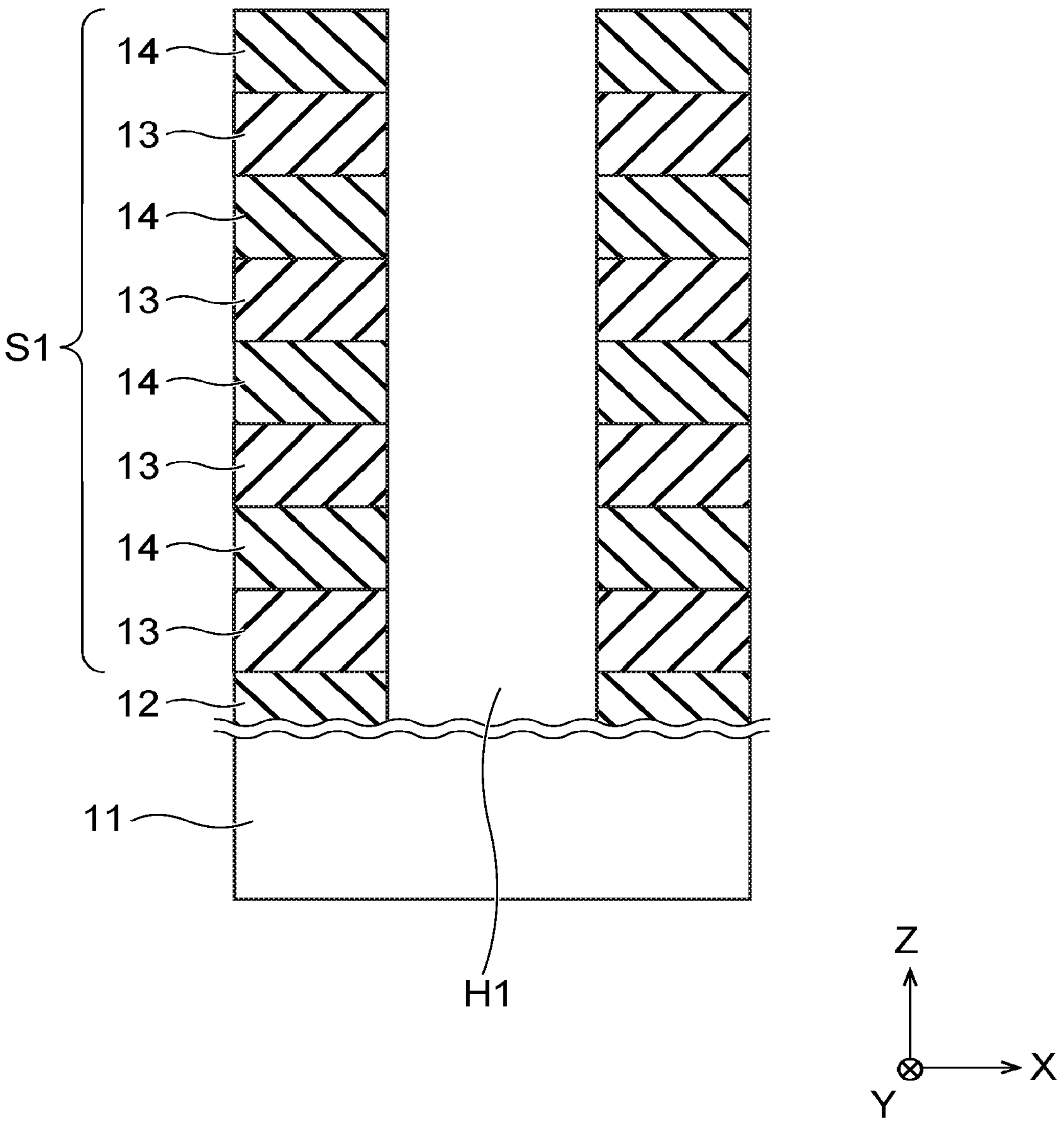
FIG. 2 is a cross-sectional view illustrating a method of manufacturing the semiconductor storage element of the first embodiment.

First, an insulator 12 is formed above a substrate 11, and a plurality of sacrifice layers 13 and a plurality of insulating layers 14 are alternately formed on the insulator 12 (FIG. 2). As a result, a multilayer film S1 alternately including the plurality of sacrifice layers 13 and the plurality of insulating layers 14 is formed on the insulator 12. The substrate 11 is, for example, a semiconductor substrate such as a silicon substrate. The insulator 12 is, for example, a silicon oxide film (SiO). Each sacrifice layer 13 is, for example, a silicon nitride film (SiN), and each insulating layer 14 is, for example, a silicon oxide film (SiO).

Subsequently, the memory hole H1 penetrating through the multilayer film S1 and the insulator 12 is formed (FIG. 2). As a result, the upper surface of a layer provided between the substrate 11 and the insulator 12 is exposed in the memory hole H1. Details of the layer will be described later.

Figure 3:
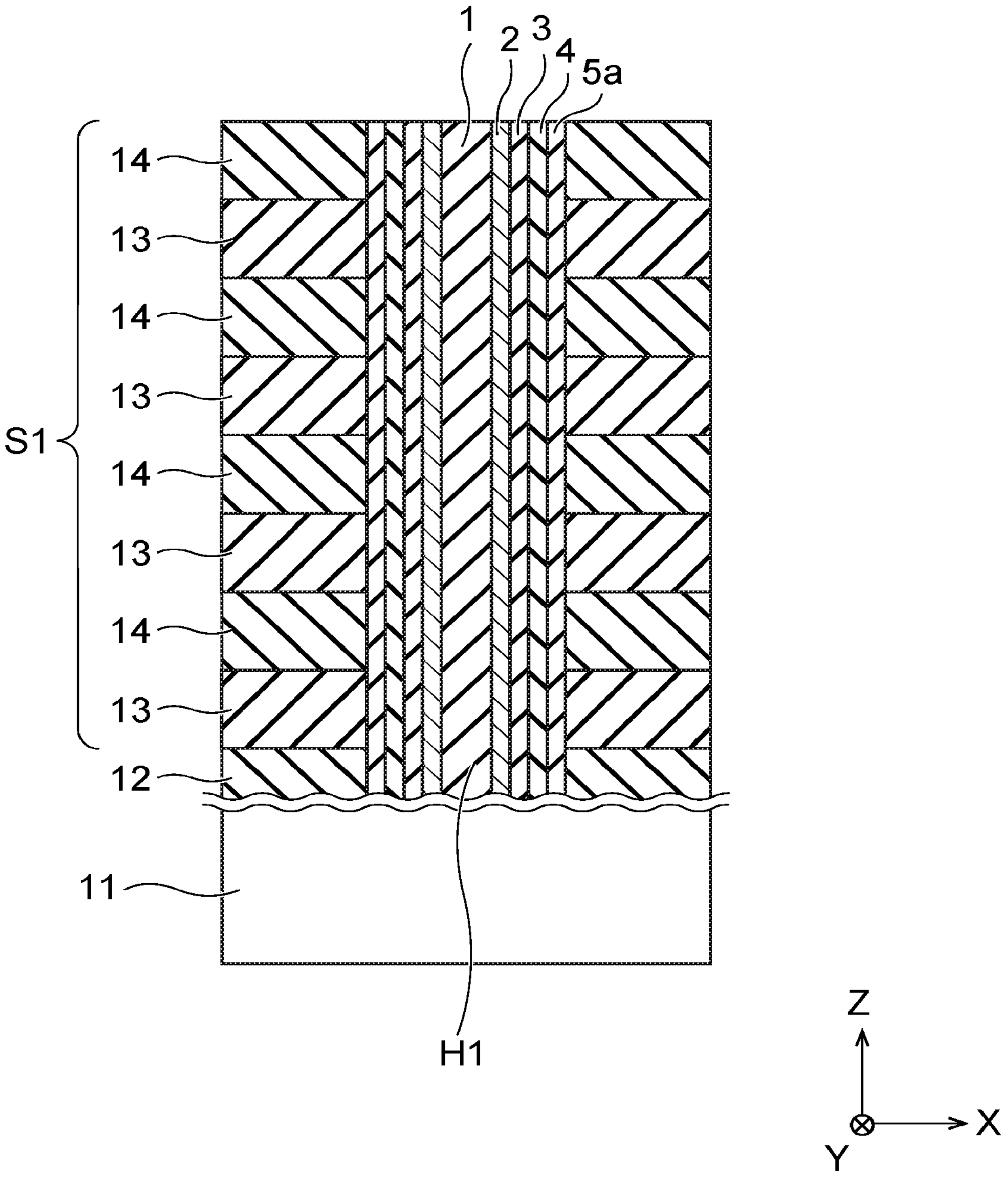
FIG. 3 is a cross-sectional view illustrating the method of manufacturing the semiconductor storage element of the first embodiment.

Subsequently, the insulator 5*a*, the electric charge accumulation film 4, the tunnel insulator 3, and part of the channel semiconductor layer 2 are sequentially formed in the memory hole H1 (FIG. 3). Subsequently, the insulator 5*a*, the electric charge accumulation film 4, the tunnel insulator 3, and the part of the channel semiconductor layer 2 are removed from a bottom part of the memory hole H1 by etching, and then, the rest of the channel semiconductor layer 2 and the core insulator 1 are sequentially formed in the memory hole H1 (FIG. 3). As a result, the insulator 5*a*, the electric charge accumulation film 4, the tunnel insulator 3, the channel semiconductor layer 2, and the core insulator 1 are sequentially formed on the side surfaces of the multilayer film S1 and the insulator 12 in the memory hole H1.

Figure 4:
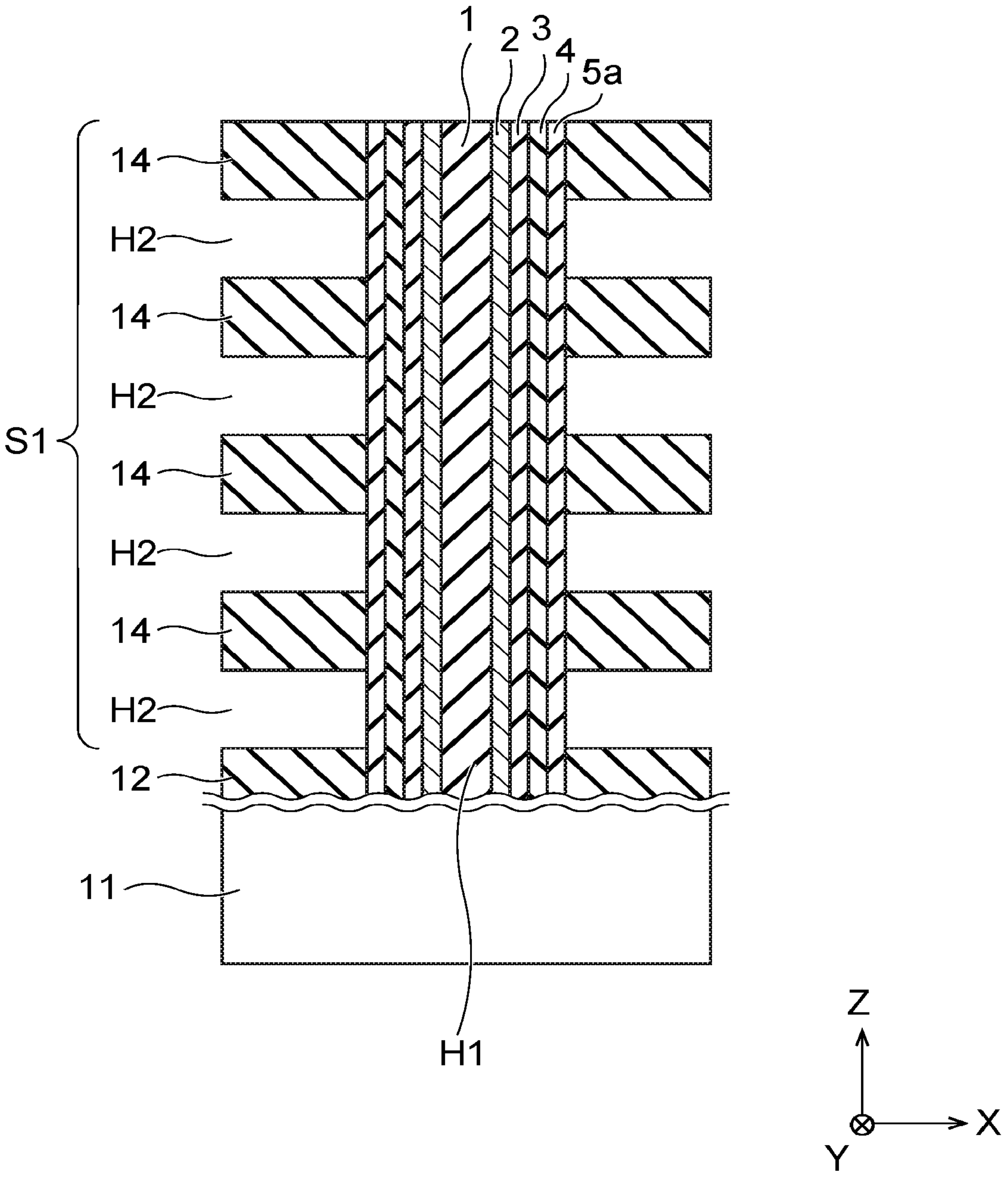
FIG. 4 is a cross-sectional view illustrating the method of manufacturing the semiconductor storage element of the first embodiment.

Subsequently, a slit (not illustrated) is formed in the multilayer film S1 and used to remove the sacrifice layers 13 with liquid chemical such as phosphoric acid. As a result, a plurality of hollow spaces H2 are formed between the insulating layers 14 (FIG. 4).

Figure 5:
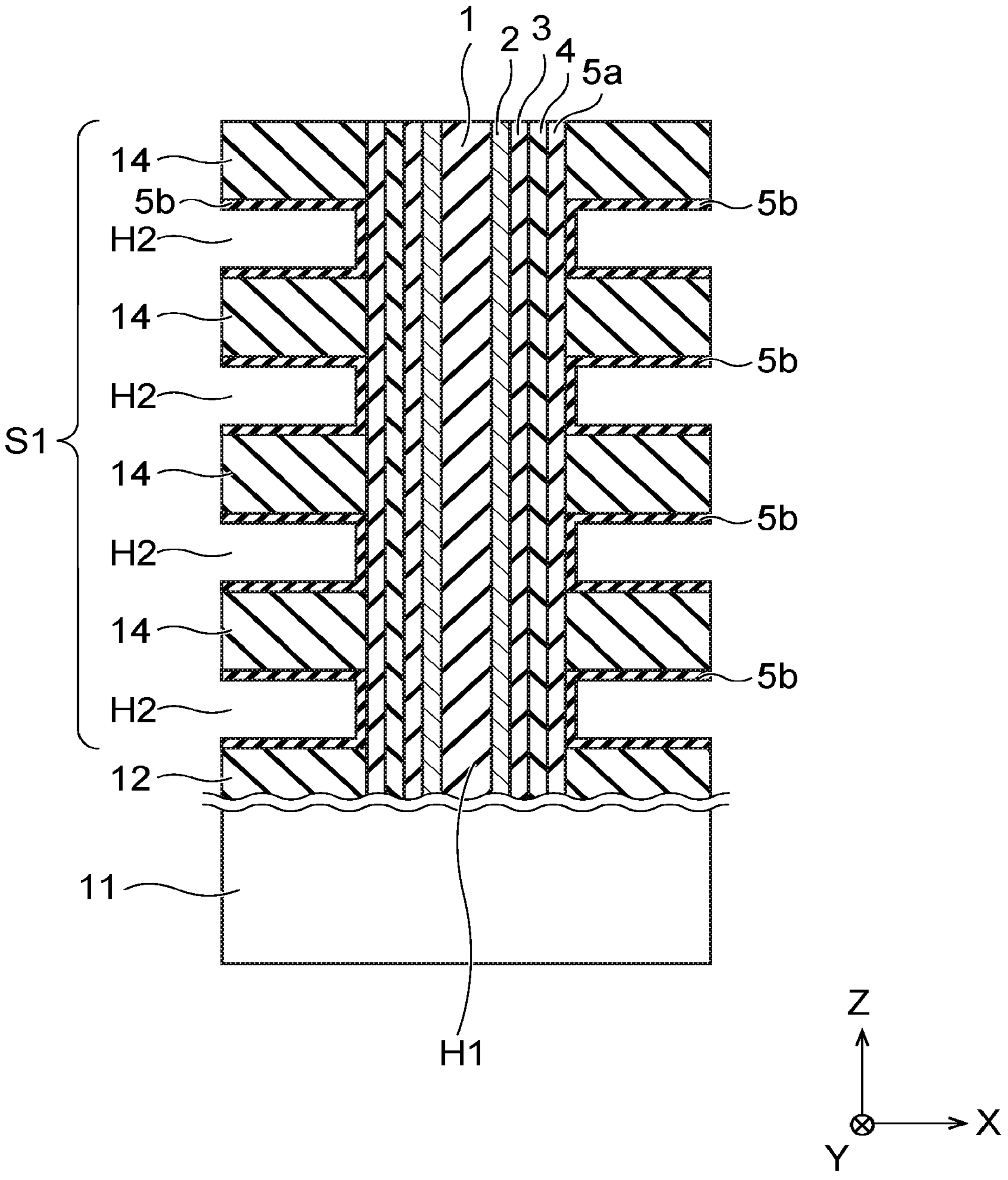
FIG. 5 is a cross-sectional view illustrating the method of manufacturing the semiconductor storage element of the first embodiment.

Subsequently, the insulator 5*b* containing aluminum oxide is formed on the surfaces of the insulating layers 14 and the insulator 5*a* in the hollow spaces H2 (FIG. 5). As a result, the block insulator 5 including the insulator 5*a* and the insulator 5*b* is formed.

Figure 6:
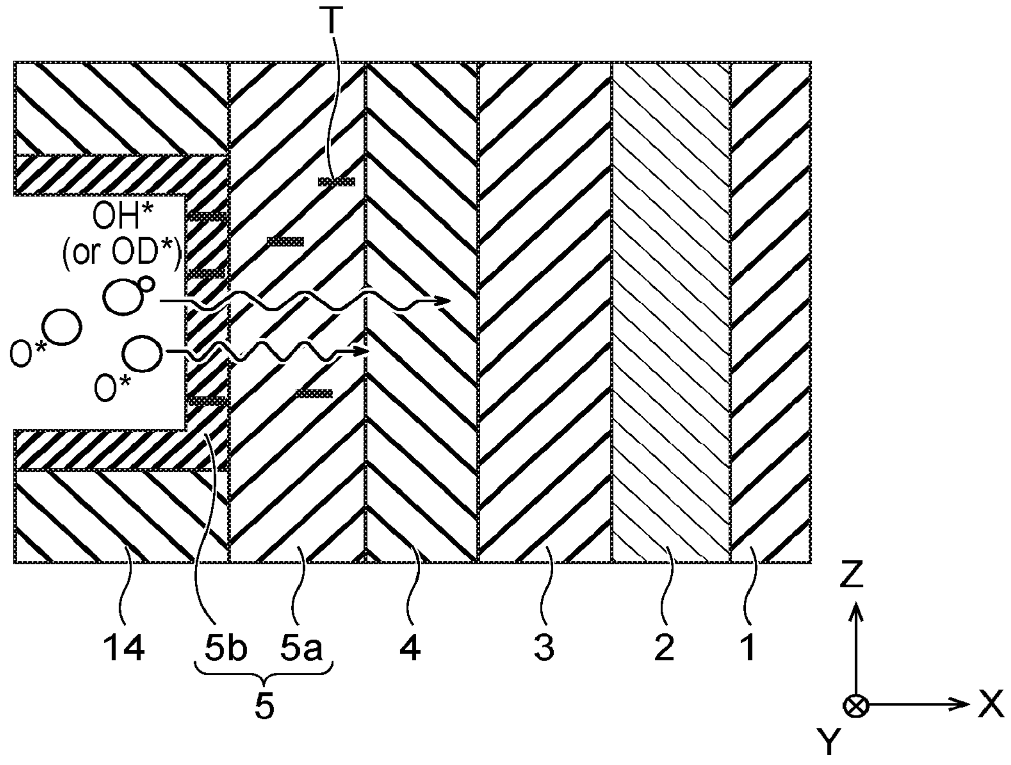
FIG. 6 is a cross-sectional view for description of thermal treatment in the method of manufacturing the semiconductor storage element of the first embodiment.

Subsequently, radical oxidation (radical reforming) is performed as illustrated in FIG. 6. The radical oxidation is performed in a heating furnace or an RTP by using OH* or OD* and using oxygen radical (O*). A thermal treatment atmosphere has a temperature in the range of 800° C. to 1100° C. The oxygen radical (O*) may be formed from oxygen ($O_2$) gas by using a plasma generation mechanism.

The radical oxidation is performed under conditions of, for example, 900° C. and 30 seconds.

Through the radical oxidation, a large number of trap levels (trap sites) T are formed in the insulators 5*a* and 5*b*. FIG. 6 omits illustrations of trap levels T included in the electric charge accumulation film 4 and the tunnel insulator 3.

Figure 7:
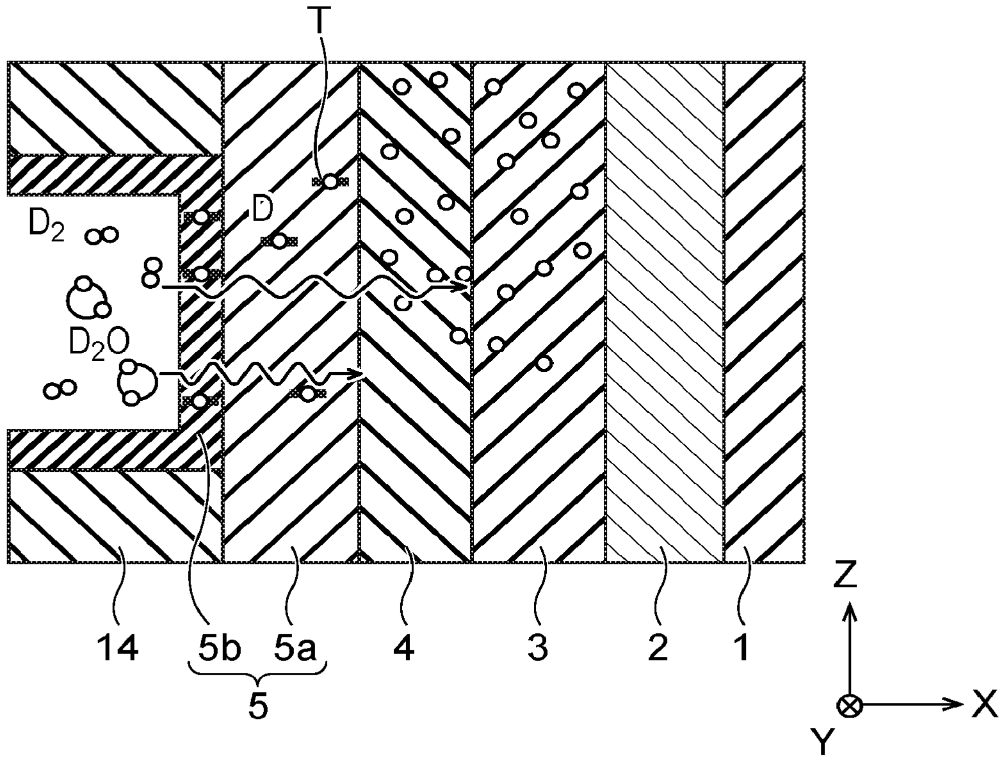
FIG. 7 is a cross-sectional view for description of the thermal treatment in the method of manufacturing the semiconductor storage element of the first embodiment.

Subsequently, rapid thermal processing (RTP) is performed under a thermal load condition of, for example, 1000° C. or higher by using deuterium ($D_2$) gas and heavy water ($D_2O$). Accordingly, crystallization and film quality improvement of the insulator 5*b* containing aluminum oxide (AlO) are performed, and deuterium (D) is introduced into the cell multilayer film, for example, the block insulator 5, the electric charge accumulation film 4, and the tunnel insulator 3 as illustrated in FIG. 7. FIG. 7 is a cross-sectional view illustrating the process of deuterium (D) introduction in one hollow space H2.

The RTP using deuterium ($D_2$) gas and heavy water ($D_2O$) is performed under conditions of, for example, 1035° C. and 0 to 10 seconds approximately. The heavy water ($D_2O$) is introduced in a liquid state into an RTP device.

An RTP using heavy water ($D_2O$) may be performed without using deuterium ($D_2$) gas. In the RTP using heavy water ($D_2O$), argon (Ar) or nitrogen ($N_2$) gas may be contained as carrier gas. When argon or nitrogen is used, deuterium ($D_2$) gas, which is expensive, is not used, and moreover, even with a small amount of heavy water ($D_2O$), deuterium (D) can be sufficiently introduced into the insulator because heavy water ($D_2O$) highly efficiently replaces light hydrogen (H) in an insulator with deuterium (D). Thus, a deuterium (D) introduction process with excellent productivity can be provided.

As illustrated in FIG. 7, a dangling bond of each trap level T formed through the process in FIG. 6 is terminated with deuterium (D). Thus, a larger amount of deuterium (D) can be introduced into the insulators 5*a* and 5*b*.

Figure 8:
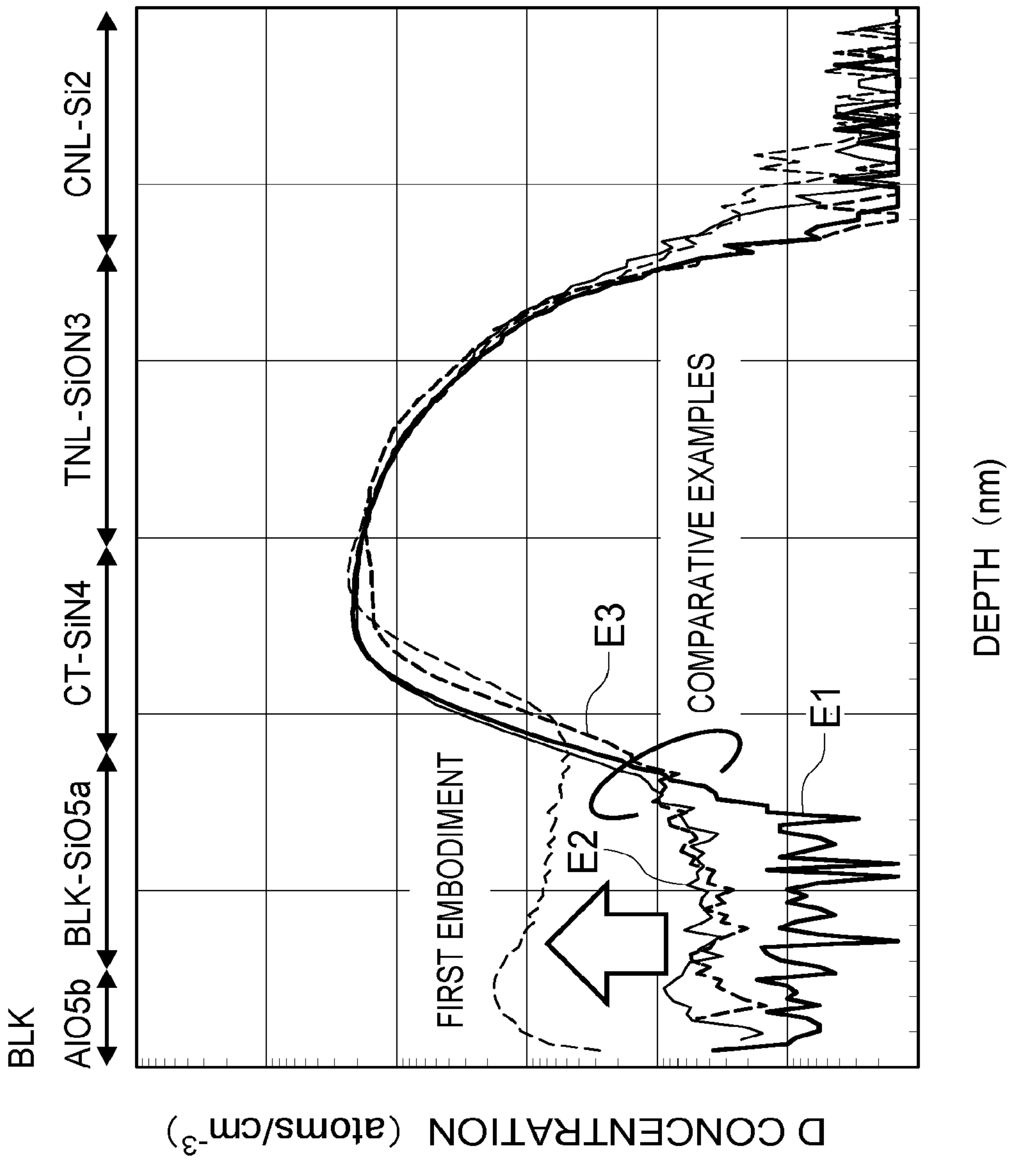
FIG. 8 is a graph illustrating distribution of deuterium introduced into a cell multilayer film through the thermal treatment illustrated in FIG. 7.

FIG. 8 illustrates concentration distribution in the depth direction after the deuterium (D) introduction. The horizontal axis represents depth from the insulator 5*b* containing AlO in the X direction, in other words, distance in the X direction. Specifically, the horizontal axis represents distance in the depth direction from the surface of the insulator 5*b* containing AlO to each of the insulator 5*b*, the insulator 5*a* containing SiO, the electric charge accumulation film 4 containing SiN, the tunnel insulator 3 containing SiON, and the channel semiconductor layer 2. The vertical axis represents the concentration of deuterium (D).

As understood from the first embodiment in FIG. 8, deuterium (D) is mainly introduced into the electric charge accumulation film 4 containing SiN and the tunnel insulator 3 containing SiON. The average concentration of deuterium (D) in the cell multilayer film decreases in the following order:

the electric charge accumulation film 4>the tunnel insulator 3>the insulator 5*b*>the insulator 5*a*.

In other words, the average concentration of deuterium (D) in the cell multilayer film decreases in the order of the electric charge accumulation film 4, the interface between the electric charge accumulation film 4 and the tunnel insulator 3, and the tunnel insulator 3. The average concentration of each film is a value obtained by integrating concentration distribution in the depth direction of the film and dividing the integrated value by the thickness (thickness in the X direction) of the film. The boundary between the electric charge accumulation film 4 containing SiN and the tunnel insulator 3 containing SION can be determined based on SiN intensity and O intensity analysis curve in secondary ion mass spectrometry (SIMS) analysis.

As described above, the average concentration of deuterium (D) in the insulator 5*b* is higher than the average concentration of deuterium (D) in the insulator 5*a*.

Figure 9:
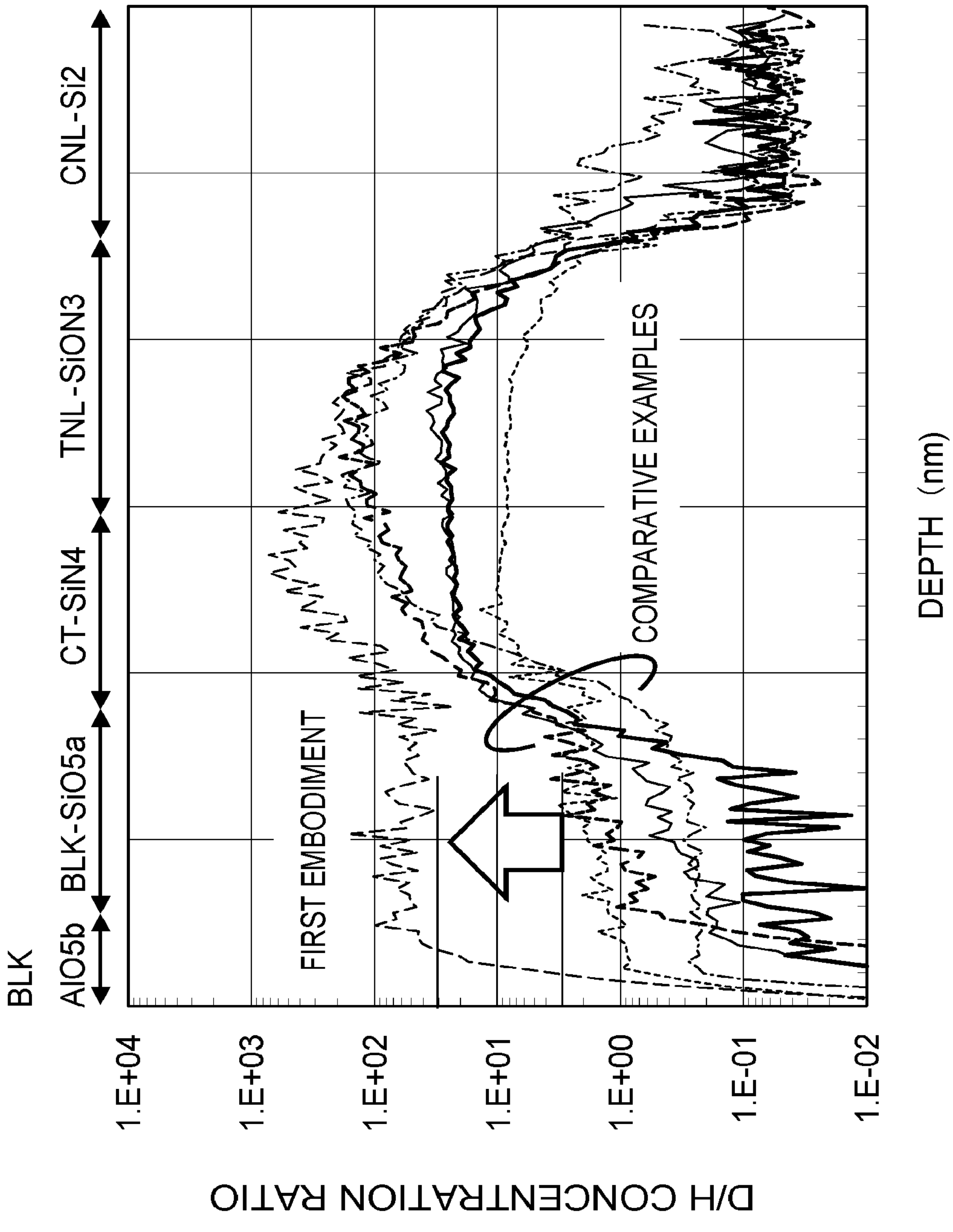
FIG. 9 is a graph illustrating distribution of the concentration ratio of deuterium concentration to light hydrogen concentration in the cell multilayer film.

FIG. 9 illustrates distribution of the concentration ratio of the concentration of deuterium (D) to the concentration of light hydrogen (H). The horizontal axis represents, as in the horizontal axis of the graph illustrated in FIG. 8, the depth of the insulator 5*b* containing AlO in the X direction, in other words, the distance of the insulator 5*b* in the X direction. The vertical axis represents the concentration ratio (D/H concentration ratio) of the concentration of deuterium (D) to the concentration of light hydrogen (H).

As understood from FIG. 9, distribution of the D/H concentration ratio from the electric charge accumulation film 4 to the channel semiconductor layer 2 has a tendency similar to that for distribution of the concentration of deuterium (D) illustrated in FIG. 8. However, the D/H concentration ratio in the insulator 5*b* is smaller than the D/H concentration ratio in the insulator 5*a*. The D/H concentration ratio in the insulator 5*a* is equal to or larger than 100 in some cases.

Through the process described above with reference to FIGS. 6 and 7, the concentration of deuterium (D) and the D/H concentration ratio in the insulators 5*a* and 5*b* can be made high. Accordingly, a larger number of dangling bonds in the insulators 5*a* and 5*b* can be terminated with deuterium (D). Moreover, light hydrogen (H) termination with low reliability can be reduced. As a result, leakage of electric charge from the electric charge accumulation film 4 to the block insulator 5 can be reduced. Thus, the data holding characteristic and the cycle resistance can be improved, and the reliability of the memory cell can be improved.

As illustrated in FIG. 9, the D/H concentration ratio in at least one of part of the insulator 5*b*, which is along the insulator 5*a*, and the insulator 5*a* is equal to or larger than one. More preferably, the D/H concentration ratio in at least one of the part of the insulator 5*b*, which is along the insulator 5*a*, and the insulator 5*a* is equal to or larger than 10. In a case where a dangling bond, which would be a defect in an insulator, is terminated with light hydrogen (H), light hydrogen (H) is eliminated with electric stress and the electric charge holding characteristic as a storage element and the resistance as an insulator degrade due to the defect. In a case where a dangling bond in an insulator is terminated with deuterium (D), deuterium (D) is stable against electric stress and unlikely to be eliminated. As a result, a dangling bond, which would be a defect, is stably terminated with deuterium (D) and the electric charge holding characteristic as a storage element and the resistance as an insulator significantly improve. The reliability of the memory cell can be significantly improved by not only introducing deuterium (D) but also reducing light hydrogen (H) to achieve the D/H concentration ratio of 10 or larger. In a case where the D/H concentration ratio is equal to or larger than 10, the fraction of dangling bonds terminated with deuterium (D) exceeds D/(D+H) or 10/(10+1)=90.9%. The characteristics of a semiconductor element can be significantly improved when the fraction of deuterium (D) termination in an insulator exceeds 90.9%.

A high dielectric insulator (High-k film) is used as the part of the insulator 5*b*, which is along the insulator 5*a*. Typically, when an insulator having a high dielectric constant k is used as a gate insulator, gate capacitance can be increased with a small thickness and the reliability of a semiconductor can be improved. However, a material with a high dielectric constant k typically tends to have small bandgap energy. Accordingly, electric charge accumulated in the electric charge accumulation film 4 is likely to leak through the part of the insulator 5*b*, which is along the insulator 5*a*, and the insulator 5*a*, and the electric charge holding characteristic is likely to degrade. Thus, the characteristics of a semiconductor element improve when the D/H concentration ratio in the High-k insulator is set to one or larger. The D/H concentration ratio is preferably set to 10 or larger (the deuterium termination fraction D/(D+H) is higher than 90.9%) to significantly improve the characteristics of a semiconductor element. A High-k insulator as the insulator 5*b* is preferably AlO, which has a dielectric constant equal to or larger than eight, or may be $ZrO_2$, $Ta_2O_5$, $TiO_2$, $HfO_2$, $HfSiO_4$, $La_2O_3$, $Y_2O_3$, or $ZrO_2$. The characteristics of a semiconductor element can be improved by using such a high dielectric insulator having a dielectric constant equal to or larger than eight, with which the D/H concentration ratio is equal to or larger than 10.

As described above, when the D/H concentration ratio in the part of the insulator 5*b*, which is along the insulator 5*a*, and the insulator 5*a* is set to 10 or larger, the average D/H concentration ratio in a cell functional insulator including the part of the insulator 5*b* along 5a, the insulator 5*a*, the electric charge accumulation film 4, and the tunnel insulator 3 can be set to 10 or larger. The average fraction (D/(D+H)) of deuterium (D) termination in the cell functional insulator can exceed 90.9%. In this manner, the characteristics of the semiconductor storage element can be improved by increasing the overall average D/H concentration ratio and the deuterium (D) termination fraction in the cell functional insulator.

Comparative examples illustrated in FIGS. 8 and 9 include a plurality of exemplary manufacturing methods.

A first comparative example (E1) is an example in which the insulator 5*b* is formed (refer to FIG. 5), an RTP with nitrogen ($N_2$) annealing is performed, radical oxidation is performed, and annealing using deuterium ($D_2$) gas is performed. The RTP with nitrogen ($N_2$) annealing is performed under conditions of, for example, 1035° C. and 10 seconds. The RTP with nitrogen ($N_2$) annealing is performed for, for example, crystallization of the insulator 5*b*. The annealing using deuterium ($D_2$) gas is performed under conditions of, for example, 800° C. and 60 minutes. The annealing using deuterium ($D_2$) gas is performed for, for example, introduction of deuterium (D).

In a second comparative example (E2), reactivation annealing is performed after the annealing using deuterium ($D_2$) gas in the first comparative example. The reactivation annealing is, for example, spike annealing at 1015° C. The annealing using deuterium ($D_2$) gas is performed in a temperature zone in which dopant is inactivated. The reactivation annealing is performed for, for example, reactivation of dopant inactivated by the annealing using deuterium ($D_2$) gas.

As illustrated in FIG. 8, according to the first embodiment, the concentration of deuterium (D) in the insulators 5*a* and 5*b* can be improved as compared to the first and second comparative examples. As illustrated in FIG. 9, according to the first embodiment, the D/H concentration ratio in the insulators 5*a* and 5*b* can be improved as compared to the first and second comparative examples.

In the first and second comparative examples, radical oxidation is performed after crystallization of the insulator 5*b*. Trap levels T are potentially unlikely to be formed in the insulator 5*b* when the insulator 5*b* is crystallized. In the first and second comparative examples, introduction of deuterium (D) is performed after crystallization of the insulator 5*b*. The insulator 5*b* before crystallization is in an amorphous state containing a large number of dangling bonds. In the insulator 5*b* after crystallization, the number of dangling bonds largely decreases and the number of dangling bonds to be terminated with deuterium (D) is small, and thus it is potentially difficult to terminate dangling bonds with deuterium (D).

In the first and second comparative examples, heavy water ($D_2O$) is not used for introduction of deuterium (D).

Furthermore, in the first and second comparative examples, the reactivation annealing is performed.

However, in the first embodiment, crystallization of the insulator 5*b* is performed after radical oxidation. Accordingly, it is thought that a larger number of trap levels T are formed in the insulator 5*a* before crystallization and a large number of trap levels T remain after crystallization of the insulator 5*b*. Moreover, in the first embodiment, crystallization of the insulator 5*b* and introduction of deuterium (D) are substantially simultaneously performed. Accordingly, introduction of deuterium (D) is performed while dangling bonds remain in the insulator 5*b*. As a result, the dangling bonds are likely to be terminated with deuterium (D).

In the first embodiment, heavy water ($D_2O$) is used for introduction of deuterium (D). Heavy water ($D_2O$) is more likely to be separated into radicals and terminate dangling bonds with deuterium (D) atoms than deuterium ($D_2$), which is relatively stable. Moreover, heavy water ($D_2O$) is oxidizing species. Since O-D coupling is stable, light hydrogen (H) can be more efficiently replaced with deuterium (D) by producing Si—O-D coupling through an oxidation process rather than replacing Si—H coupling with Si-D coupling. Thus, the concentration of deuterium (D) can be made more likely to be improved by using heavy water ($D_2O$). As for a High-k insulator such as AlO, as well, light hydrogen in the insulators 5*a* and 5*b* can be made likely to be replaced with deuterium by replacing O—H coupling with O-D coupling. O—H coupling introduced by radicals through introduction of OH* into a High-k insulator by radical oxidation before heavy water ($D_2O$) treatment can be further replaced with O-D coupling. In this manner, a high dielectric insulator having the D/H concentration ratio of 10 or higher can be obtained.

In the first embodiment, introduction of deuterium (D) is performed by an RTP substantially simultaneously with crystallization of the insulator 5*b*. Accordingly, annealing using deuterium ($D_2$) gas is unnecessary. Thus, dopant is not inactivated and reactivation annealing is unnecessary.

A third comparative example (E3) is an example in which radical oxidation is performed after an RTP using deuterium ($D_2$) gas and heavy water ($D_2O$), in other words, the process illustrated in FIG. 6 is performed after the process illustrated in FIG. 7.

As illustrated in FIG. 8, in the first embodiment, the concentration of deuterium (D) in the insulators 5*a* and 5*b* can be improved as compared to the third comparative example. As illustrated in FIG. 9, in the first embodiment, the D/H concentration ratio in the insulators 5*a* and 5*b* can be improved as compared to the third comparative example.

In the third comparative example, as in the first and second comparative examples, radical oxidation is performed after crystallization of the insulator 5*b*.

However, in the first embodiment, crystallization of the insulator 5*b* is performed after radical oxidation. Accordingly, it is thought that a larger number of trap levels T are formed in the insulator 5*a* before crystallization and a large number of trap levels T remain after crystallization of the insulator 5*b*.

In the method described in the first embodiment, crystallization of the insulator 5*b* is performed after radical oxidation, but since the crystallization and replacement of light hydrogen with deuterium in the radical oxidation are mutually affecting processes, a significant amount of work is needed to improve device reliability degradation by combining process parameters (such as temperature, time, pressure, oxidation amount, temperature increase/decrease speed, and the order of crystallization, radical oxidation, and other annealing). However, degradation of device performance reliability can be reduced by considering the D/H concentration ratio in the insulators 5*a* and 5*b* and selecting a process that provides the part of the insulator 5*b*, which is along the insulator 5*a* and in which the D/H concentration ratio exceeds 10.

According to the above description, it is possible to form a structure in which the interfaces between the insulator 5*a*, the insulator 5*b*, the electric charge accumulation film 4, and the tunnel insulator 3 are terminated with deuterium (D) as in the present embodiment. Through repetition of write/erase operation, defects are generated in the electric charge accumulation film 4 and the tunnel insulator 3, and part of electric charge accumulated in the electric charge accumulation film 4 leaks through the defects. This can cause a data loss. Defects in the electric charge accumulation film 4 and the tunnel insulator 3 are thought to be generated as light hydrogen (H) intentionally or unintentionally introduced at memory cell formation is eliminated by electric stress through write/erase operation. Moreover, according to the present embodiment, the amount of a light hydrogen (H) component in the insulator 5*a*, which is eliminated by electric stress through write/erase operation can be reduced by increasing the D/H concentration ratio in the insulator 5*a* to 10 or larger. As a result, it is possible to reduce leakage of part of electric charge to the electrode layer 6, thereby improving the element characteristics.

When deuterium (D) is introduced into a SiN or SiON film, N—H coupling in the film is replaced with N-D coupling. N-D coupling has extremely stronger electric stress resistance than N—H coupling. In other words, robust coupling against electric stress can be obtained by replacing a place that would be a coupling defect with deuterium (D). Thus, it is possible to reduce degradation of the electric charge accumulation film 4 and the tunnel insulator 3 through write/erase operation by decreasing the number of N—H coupling sites and increasing the number of N-D coupling sites in the electric charge accumulation film 4 and the tunnel insulator 3. It is also possible to reduce false writing at writing and reading. In addition, it is possible to obtain an effect of reducing reliability degradation when write/erase operation is repeated. Thus, it is possible to obtain a semiconductor storage element that can reduce degradation of the reliability of a memory cell.

In the present embodiment, the structure with deuterium (D) termination can be also formed at the interface between the electric charge accumulation film 4 and the insulator 5*a* and the interface between the insulator 5*a* and the insulator 5*b*. Electric charge accumulated in the electric charge accumulation film 4 potentially leaks to the insulator 5*a* side. It is possible to further reduce leakage of electric charge in the electric charge accumulation film 4 by actively introducing deuterium (D) into the insulator 5*a* and the insulator 5*b*. Accordingly, the data holding characteristic and the cycle resistance can be improved, and the reliability of the memory cell can be improved.

In the present embodiment, treatment is performed to increase the concentration of deuterium (D) in the insulators 5*a* and 5*b* and decrease the concentration of light hydrogen (H). Accordingly, the data holding characteristic and the cycle resistance can be improved, and the reliability of the memory cell can be improved. In the first, second, and third comparative examples, the deuterium concentration in the electric charge accumulation film 4 and the tunnel insulator 3 was equivalent to that in an example, but in the first embodiment, the reliability of the memory cell was significantly improved. Although improvement of a memory cell reliability indicator with respect to memory cell reliability in the first comparative example was 40 in the second comparative example and 280 in the third comparative example, the memory cell reliability indicator in the first embodiment was improved by 1080.

In a modification of the present embodiment, a process using deuterium ($D_2$) gas and heavy water ($D_2O$) may be used as reactivation annealing. The D/H concentration ratio in the insulators 5*a* and 5*b* can be increased by performing, for example, spike annealing treatment at a treatment temperature equal to or higher than 1000° C. for a shorter holding time (for example, within five seconds) in deuterium ($D_2$) gas and heavy water ($D_2O$) atmosphere. The spike annealing treatment is annealing treatment with high temperature increase/decrease speed and a shortened stay time at a peak temperature in an RTP. Since deuterium (D) termination potentially reduces through subsequent process treatment, the D/H concentration ratio can be maintained high by performing a process using deuterium ($D_2$) gas and heavy water ($D_2O$) at the end of a manufacturing process with a high thermal load. For example, a process temperature using deuterium ($D_2$) gas and heavy water ($D_2O$) is higher than in all subsequent temperature processes in a manufacturing process. Through such a process, it is possible to obtain a device with an increased D/H concentration ratio and further reduction of reliability degradation. The memory cell reliability indicator in the present modification was improved by 1240.

Figure 10:
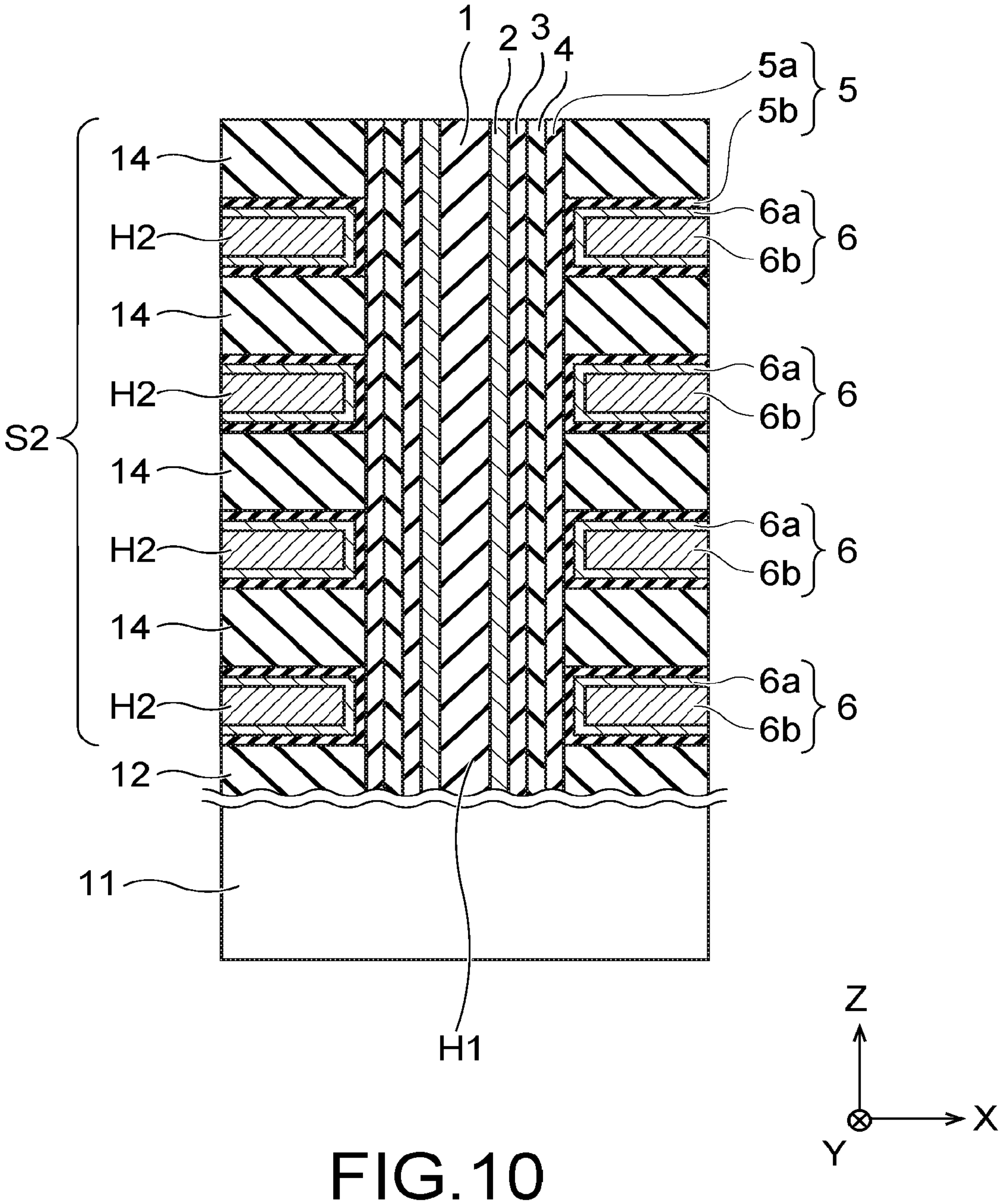
FIG. 10 is a cross-sectional view illustrating the method of manufacturing the semiconductor storage element of the first embodiment.

After such an RTP using deuterium ($D_2$) gas and heavy water ($D_2O$) is performed, the barrier metal layer 6*a* and the electrode material layer 6*b* are sequentially formed on the surface of the insulator 5*b* in the hollow spaces H2 through a normal process (FIG. 10). As a result, the electrode layer 6 including the barrier metal layer 6*a* and the electrode material layer 6*b* is formed in each hollow space H2, and a multilayer film S2 alternately including the plurality of electrode layers 6 and the plurality of insulating layers 14 is formed on the insulator 12. Treatment that removes the sacrifice layers 13 and forms the insulator 5*b*, the barrier metal layer 6*a*, and the electrode material layer 6*b* is referred to as replacement treatment.

In this manner, the semiconductor storage element of the present embodiment is manufactured (FIG. 10). FIG. 1 illustrates part of the semiconductor storage element illustrated in FIG. 10.

As described above, according to the present embodiment, it is possible to obtain a semiconductor storage element that can reduce degradation of the reliability of the memory cell.

Second Embodiment

A semiconductor storage element of a second embodiment will be described below with reference to FIGS. 11 to 20. FIGS. 11 to 20 are cross-sectional views illustrating a method of manufacturing the semiconductor storage element of the second embodiment.

Figure 11:
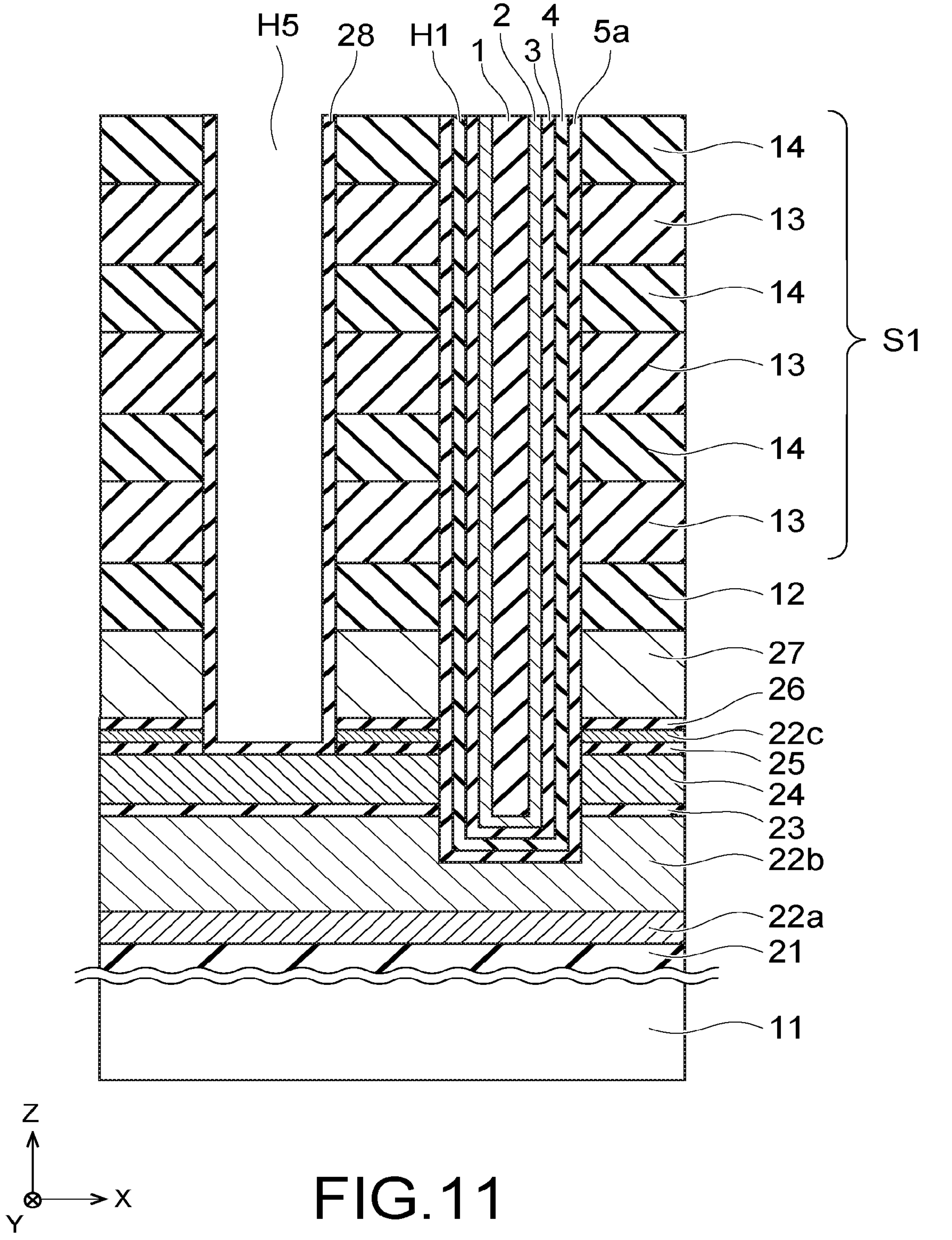
FIG. 11 is a cross-sectional view illustrating a method of manufacturing a semiconductor storage element of a second embodiment.

FIG. 11 illustrates a section after a slit (H5) is formed in the multilayer film S1 in the process illustrated in FIG. 4 and before the sacrifice layers 13 are removed through the process in FIG. 4. FIG. 11 illustrates the insulator 5*a*, the electric charge accumulation film 4, the tunnel insulator 3, the channel semiconductor layer 2, and the core insulator 1, which are sequentially formed in the memory hole H1. The insulator 5*a*, the electric charge accumulation film 4, and the tunnel insulator 3 in FIG. 11 are not removed from the bottom part of the memory hole H1 but remain. Such a structure is employed, for example, in a case where the multilayer film S1 is thick.

FIG. 11 additionally illustrates an insulator 21, a metal layer 22*a*, a lower semiconductor layer 22*b*, an insulator 23, a semiconductor layer 24, an insulator 25, an upper semiconductor layer 22*c*, an insulator 26, and a gate layer 27, which are sequentially formed above the substrate 11. The insulator 12 of the present embodiment is formed above the substrate 11 with these insulators and layers interposed therebetween in the process in FIG. 2. The insulator 21 is, for example, a silicon oxide film. The metal layer 22*a* is, for example, a W layer. The lower semiconductor layer 22*b* is, for example, a polysilicon layer. The insulator 23 is, for example, a silicon oxide film. The semiconductor layer 24 is, for example, a polysilicon layer. The insulator 25 is, for example, a silicon oxide film. The upper semiconductor layer 22*c* is, for example, a polysilicon layer. The insulator 26 is, for example, a silicon oxide film. The gate layer 27 is, for example, a polysilicon layer. The metal layer 22*a*, the lower semiconductor layer 22*b*, and the upper semiconductor layer 22*c* constitute a source line 22. Accordingly, the channel semiconductor layer 2 is electrically connected to the source line 22. Electrical connection between A and B may be direct connection between A and B or may be indirect connection between A and B through an electric conductor.

The memory hole H1 of the present embodiment is formed to reach the lower semiconductor layer 22*b* through the multilayer film S1, the insulator 12, the gate layer 27, the insulator 26, the upper semiconductor layer 22*c*, the insulator 25, the semiconductor layer 24, and the insulator 23 in the process in FIG. 2. The insulator 5*a*, the electric charge accumulation film 4, the tunnel insulator 3, the channel semiconductor layer 2, and the core insulator 1 are sequentially formed in the memory hole H1 in the process in FIG. 3.

In the process illustrated in FIG. 11, a slit H5 is formed to reach the semiconductor layer 24 through the multilayer film S1, the insulator 12, the gate layer 27, the insulator 26, the upper semiconductor layer 22*c*, and the insulator 25. The slit H5 is an example of a first recessed part. In the process in FIG. 11, an insulator 28 is also formed on the side and bottom surfaces of the slit H5. The insulator 28 is, for example, a SiN film.

Figure 12:
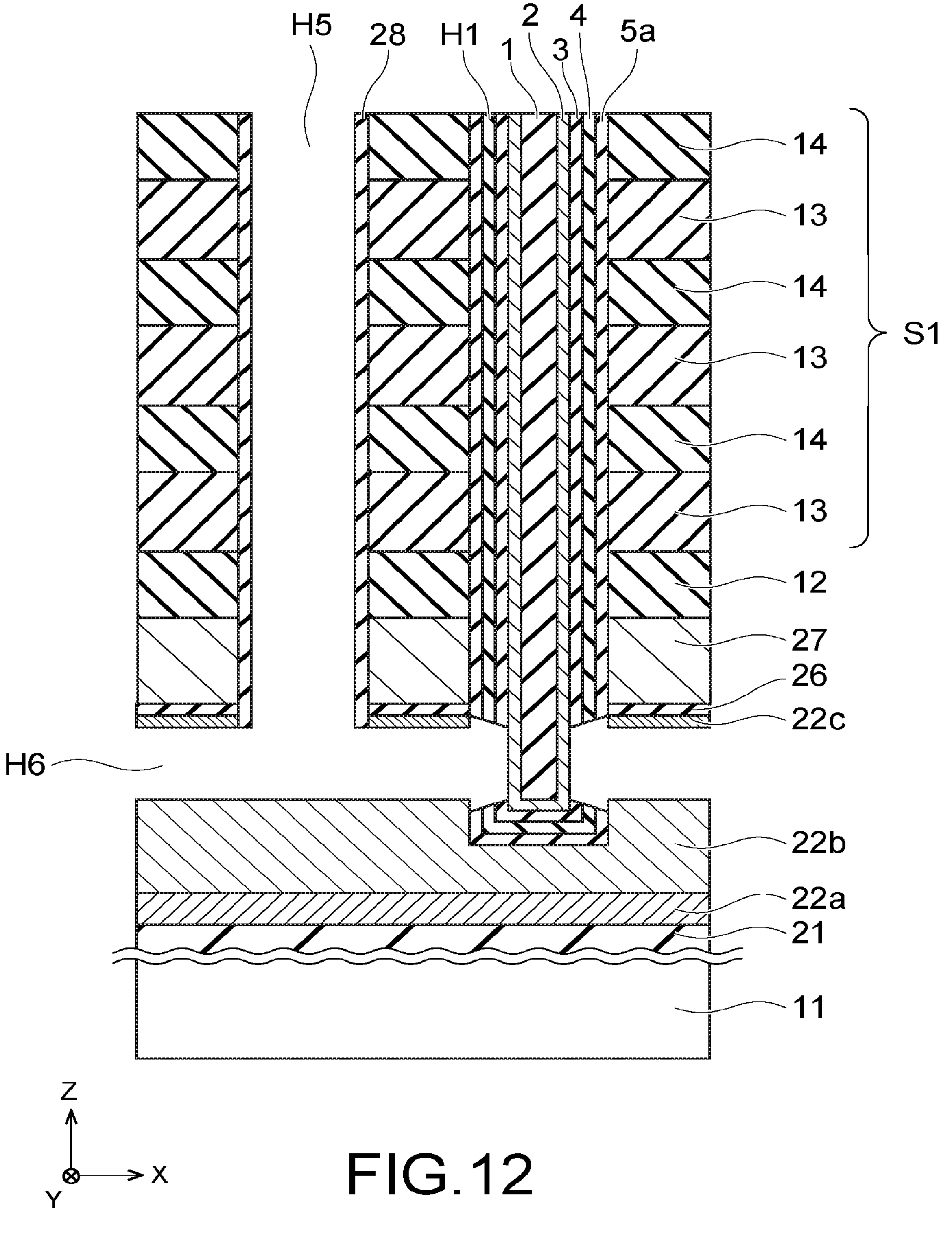
FIG. 12 is a cross-sectional view illustrating the method of manufacturing the semiconductor storage element of the second embodiment.

Subsequently, the insulator 28 is removed from a bottom part of the slit H5 by etching, and the semiconductor layer 24 is removed by wet etching using the slit H5 (FIG. 12). As a result, a hollow space H6 is formed between the insulator 25 and the insulator 23. Subsequently, the insulator 25 and the insulator 23 are removed by chemical dry etching (CDE) using the slit H5 and the hollow space H6, and the insulator 5*a*, the electric charge accumulation film 4, and the tunnel insulator 3, which are exposed in the hollow space H6 are fabricated (FIG. 10). As a result, the volume of the hollow space H6 increases and the side surface of the channel semiconductor layer 2 is exposed in the hollow space H6.

Figure 13:
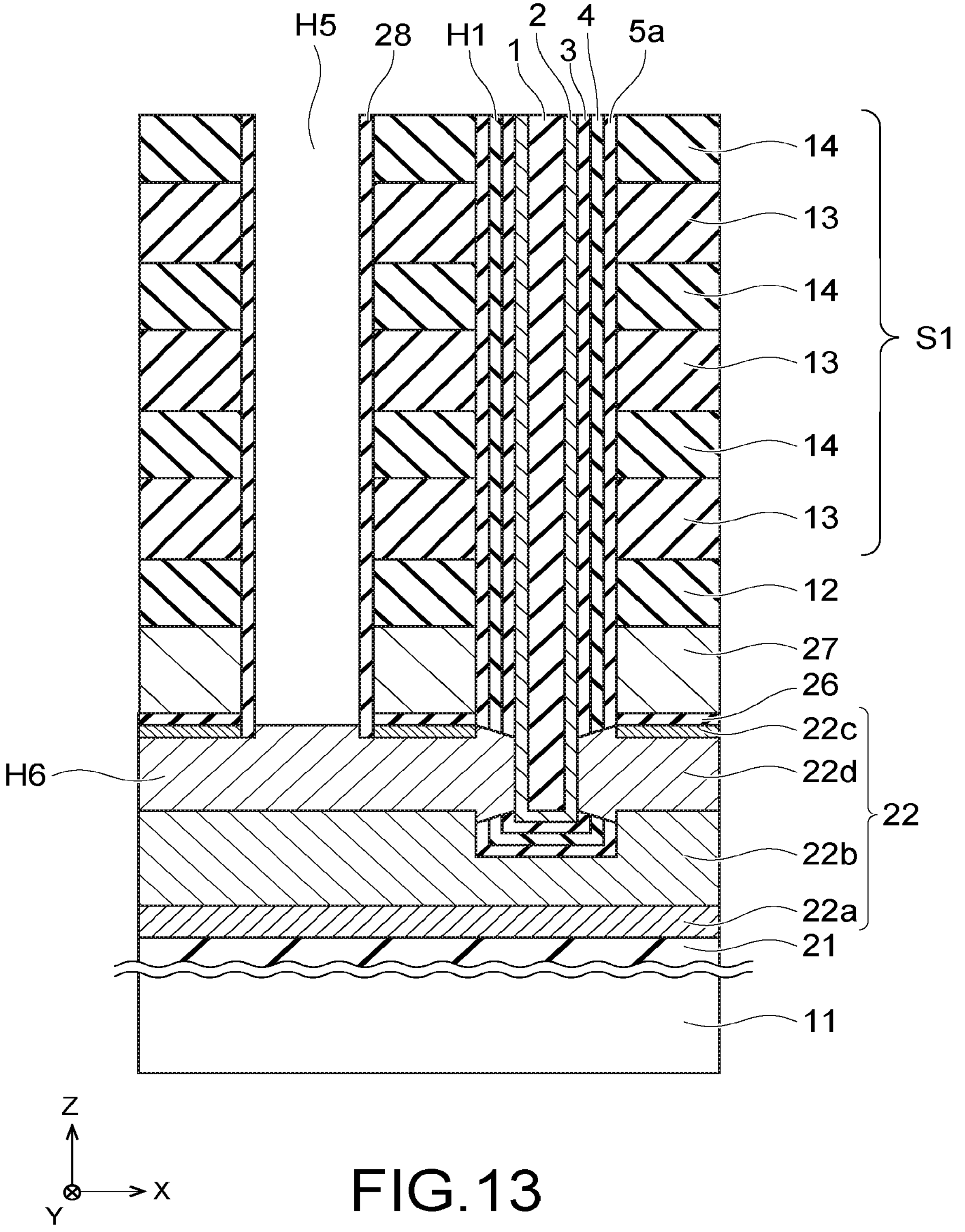
FIG. 13 is a cross-sectional view illustrating the method of manufacturing the semiconductor storage element of the second embodiment.

Subsequently, a middle semiconductor layer 22*d* is formed in the hollow space H6 (FIG. 13). As a result, the middle semiconductor layer 22*d* is formed between the lower semiconductor layer 22*b* and the upper semiconductor layer 22*c*, and the source line 22 sequentially including the metal layer 22*a*, the lower semiconductor layer 22*b*, the middle semiconductor layer 22*d*, and the upper semiconductor layer 22*c* is formed. The middle semiconductor layer 22*d* is, for example, a polysilicon layer doped with phosphorus (P). The source line 22 is electrically connected to the channel semiconductor layer 2 through the middle semiconductor layer 22*d*.

Figure 14:
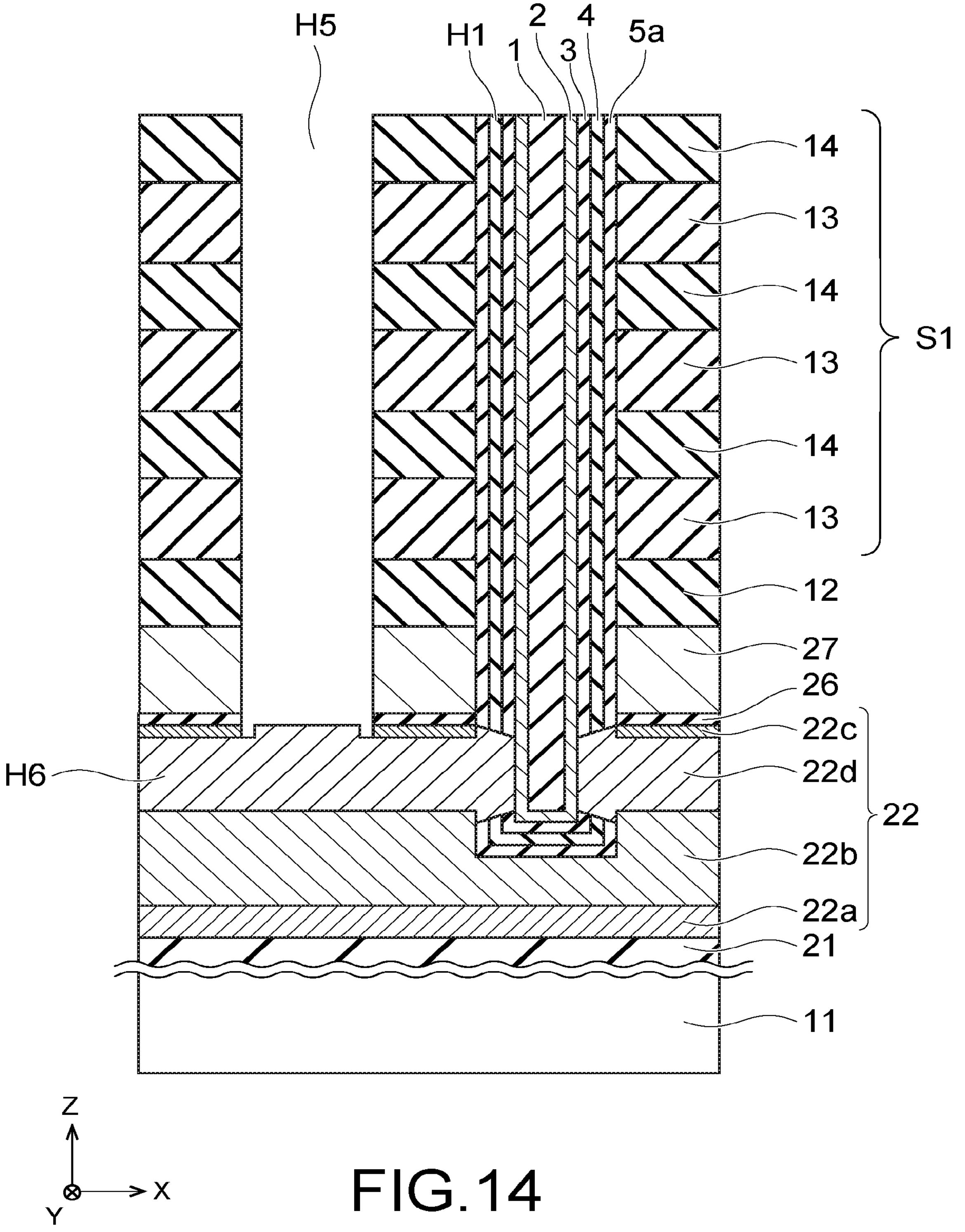
FIG. 14 is a cross-sectional view illustrating the method of manufacturing the semiconductor storage element of the second embodiment.

Subsequently, the insulator 28 is removed from the slit H5 (FIG. 14). As a result, the side surface of the multilayer film S1 is exposed in the slit H5.

Figure 15:
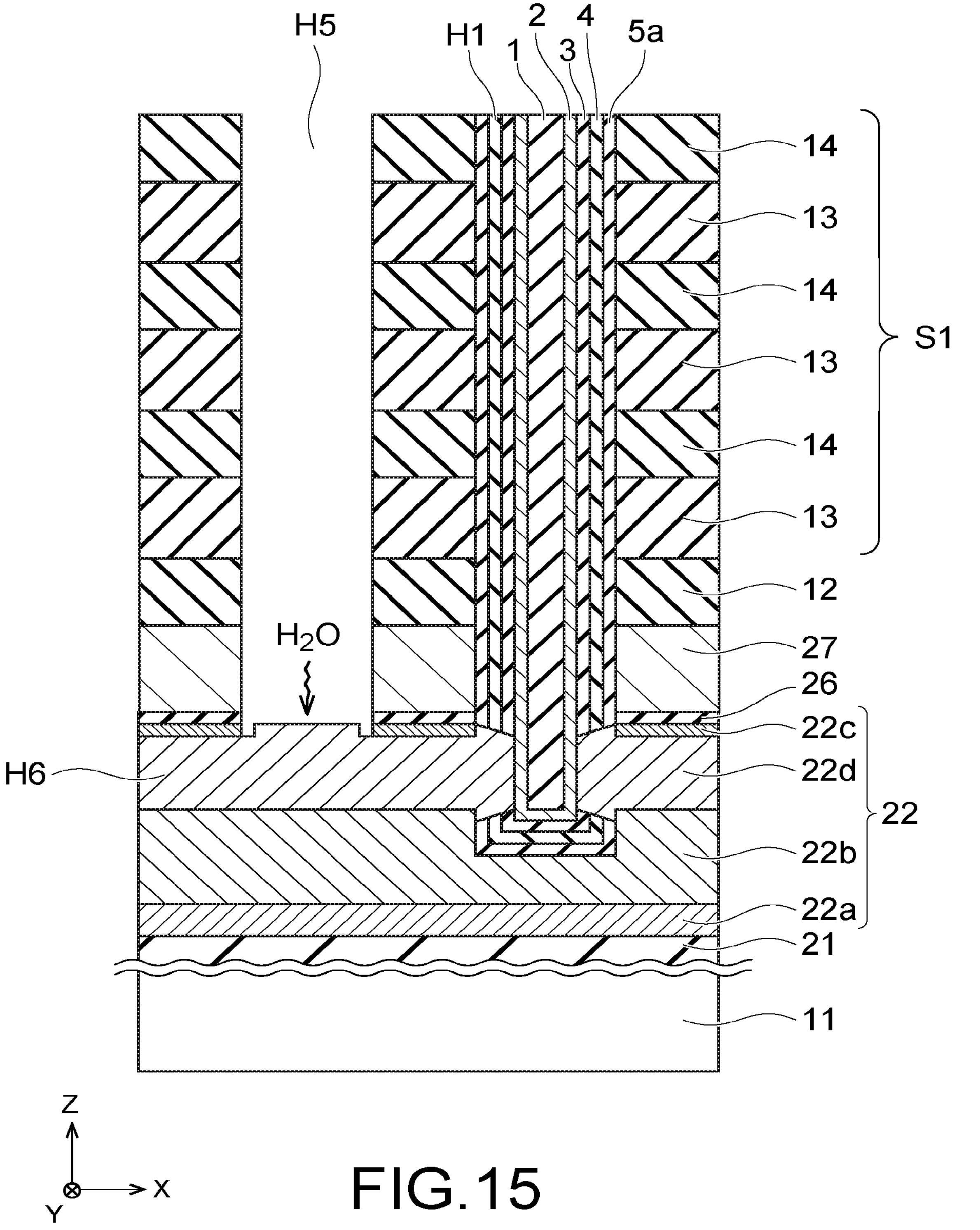
FIG. 15 is a cross-sectional view illustrating the method of manufacturing the semiconductor storage element of the second embodiment.
Figure 16:
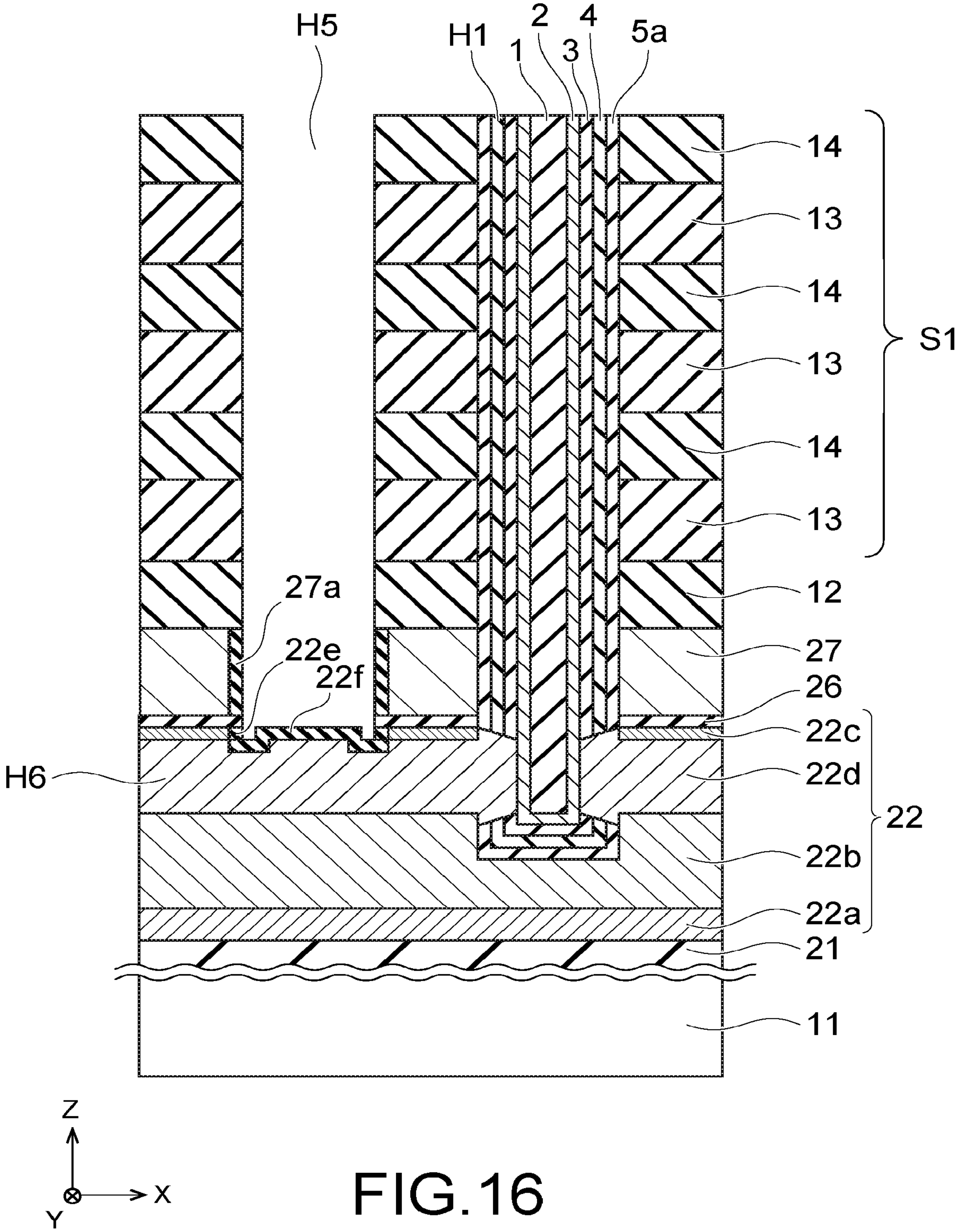
FIG. 16 is a cross-sectional view illustrating the method of manufacturing the semiconductor storage element of the second embodiment.

Subsequently, steam ($H_2O$) is supplied into the slit H5 to perform oxidation treatment (FIG. 15). As a result, the surfaces of the upper semiconductor layer 22*c*, the middle semiconductor layer 22*d*, and the gate layer 27 exposed in the slit H5 are oxidized by the steam, and accordingly, as illustrated in FIG. 16, an oxide film 22*e* (for example, a SiO film) is formed through the oxidation of the surface of the upper semiconductor layer 22*c*, an oxide film 22*f* (for example, a SiO film) is formed through the oxidation of the surface of the middle semiconductor layer 22*d*, and an oxide film 27*a* (for example, a SiO film) is formed through the oxidation of the surface of the gate layer 27.

Figure 17:
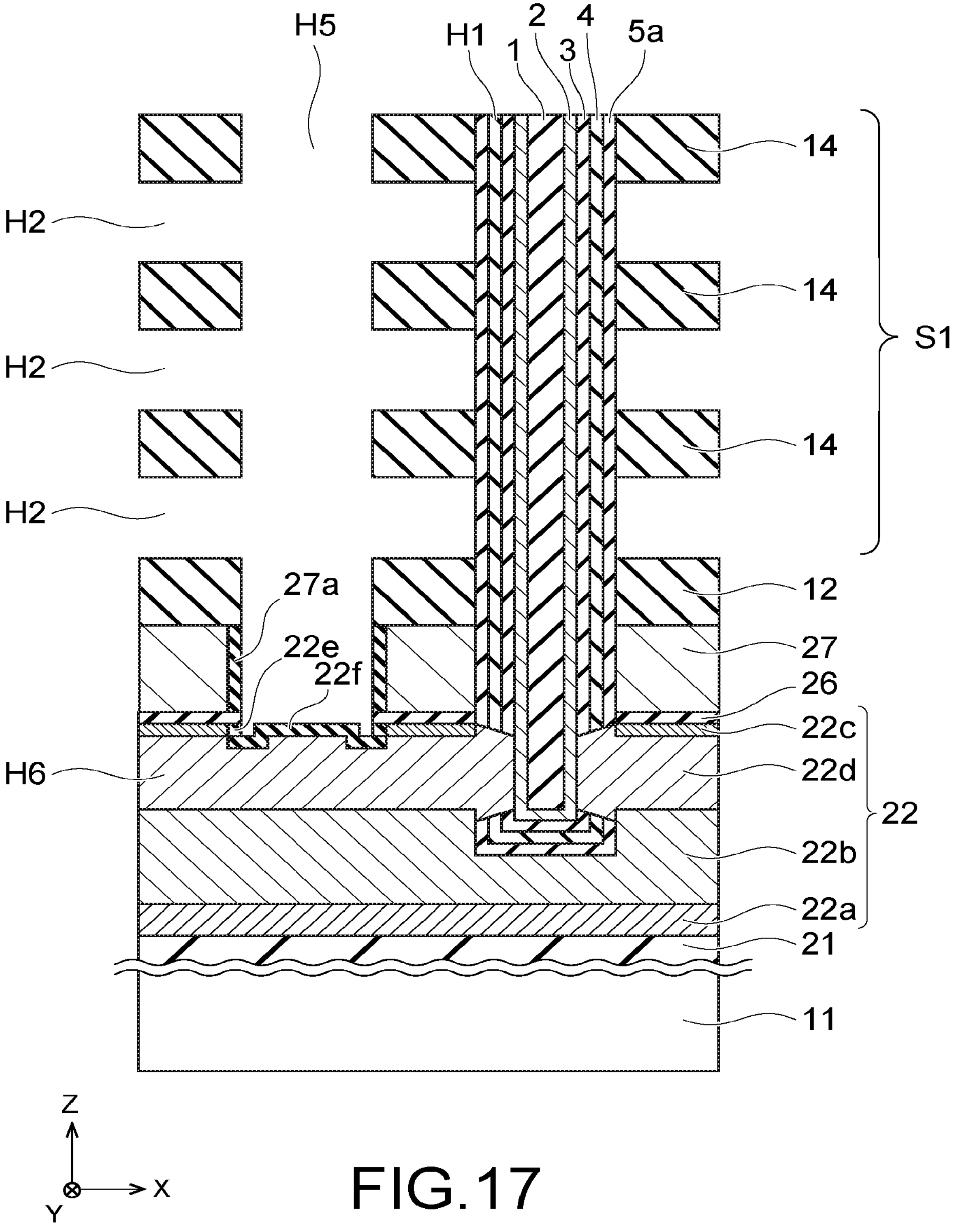
FIG. 17 is a cross-sectional view illustrating the method of manufacturing the semiconductor storage element of the second embodiment.

Subsequently, the sacrifice layers 13 is removed with liquid chemical such as phosphoric acid by using the slit H5. As a result, a plurality of hollow spaces H2 are formed between the insulating layers 14 (FIG. 17). The upper semiconductor layer 22*c*, the middle semiconductor layer 22*d*, and the gate layer 27 are covered by the oxide films 22*e*, 22*f*, and 27*a* and thus not removed through the process in FIG. 17.

Figure 18:
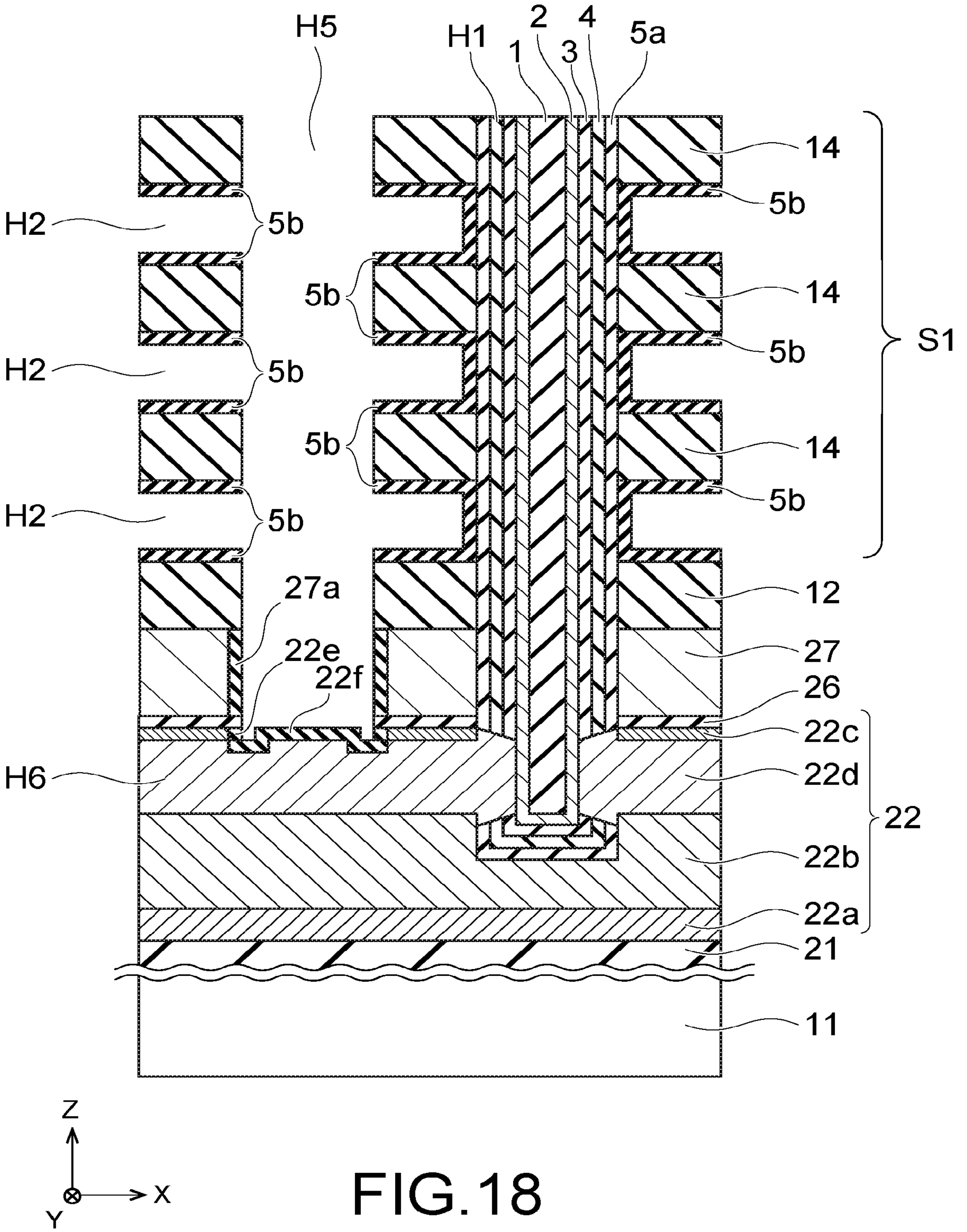
FIG. 18 is a cross-sectional view illustrating the method of manufacturing the semiconductor storage element of the second embodiment.
Figure 19:
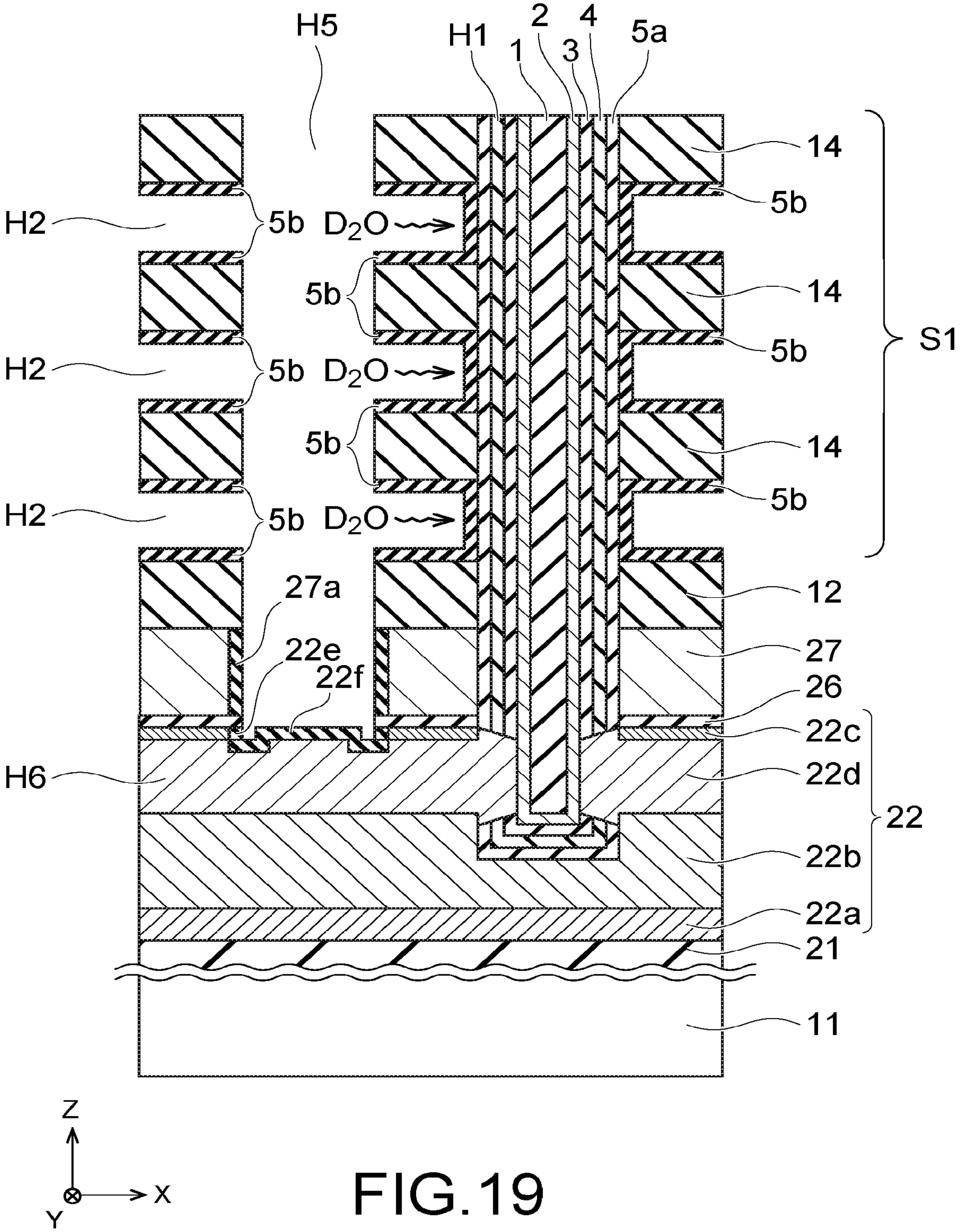
FIG. 19 is a cross-sectional view illustrating the method of manufacturing the semiconductor storage element of the second embodiment.

Subsequently, the insulator 5*b* containing AlO is formed on the surfaces of the insulating layers 14 and the insulator 5*a* in the hollow spaces H2 (FIG. 18). Thereafter, the thermal treatment described above in the first embodiment is performed to introduce deuterium (D) into the insulator 5*b* containing AlO, the insulator 5*a* containing SiO, the electric charge accumulation film 4 containing SiN, and the tunnel insulator 3 containing SiON (FIG. 19).

Figure 20:
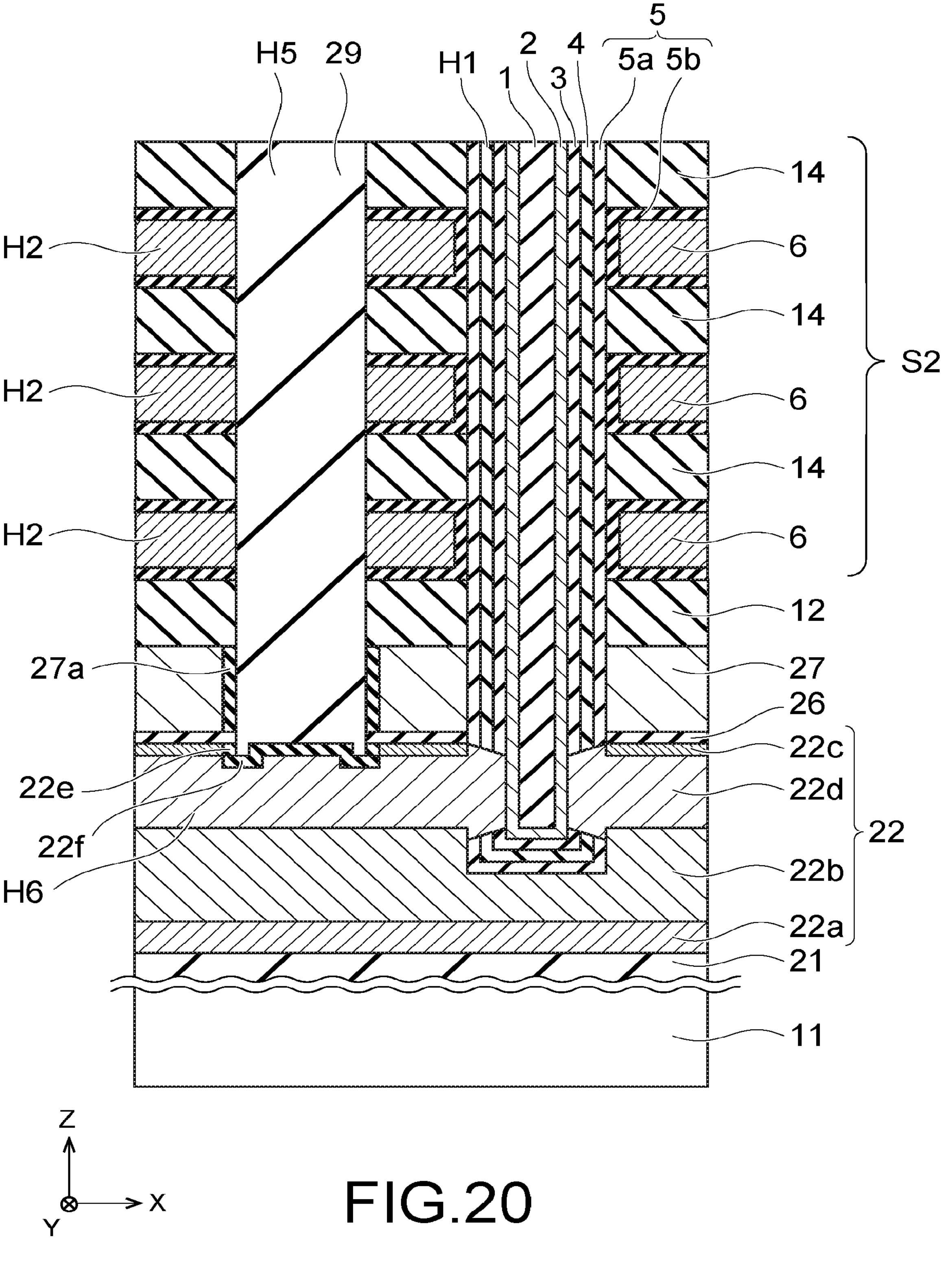
FIG. 20 is a cross-sectional view illustrating the method of manufacturing the semiconductor storage element of the second embodiment.

Subsequently, the barrier metal layer 6*a* and the electrode material layer 6*b* are sequentially formed on the surface of the insulator 5*b* in the hollow spaces H2 (FIG. 20). As a result, the block insulator 5 including the insulator 5*a* and the insulator 5*b* is formed. In addition, the electrode layer 6 including the barrier metal layer 6*a* and the electrode material layer 6*b* is formed in each hollow space H2, and the multilayer film S2 alternately including the plurality of electrode layers 6 and the plurality of insulating layers 14 is formed on the insulator 12. Subsequently, an insulator 29 is formed in the slit H5 (FIG. 20). The insulator 29 is, for example, a silicon oxide film.

In this manner, the semiconductor storage element of the second embodiment is manufactured (FIG. 20). FIG. 1 illustrates part of the semiconductor storage element illustrated in FIG. 20. The semiconductor storage element of the second embodiment can reduce degradation of the reliability of the memory cell as in the first embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage element comprising:

a laminated body in which insulating layers and conductive layers are alternately laminated in a first direction;

a semiconductor layer disposed in the first direction in the laminated body;

a first insulator disposed in the first direction between the laminated body and the semiconductor layer;

a second insulator disposed in the first direction between the laminated body and the first insulator;

a third insulator disposed in the first direction between the laminated body and the second insulator; and a fourth insulator including a first part and a second part, the first part being disposed between each of the conductive layers and the third insulator, the second part being disposed in a second direction intersecting the first direction between each of the conductive layers and the insulating layer and connected to the first part, wherein an average concentration of deuterium in the first part is higher than an average concentration of heavy in the third insulator, and a ratio of deuterium concentration to light hydrogen concentration in the first part is smaller than a ratio of deuterium concentration to light hydrogen concentration in the third insulator.

2. The semiconductor storage element according to claim 1, wherein the ratio of deuterium concentration to light hydrogen concentration in at least one of the first part and the third insulator is equal to or larger than one.

3. The semiconductor storage element according to claim 2, wherein the ratio of deuterium concentration to light hydrogen concentration in at least one of the first part and the third insulator is equal to or larger than 10.

4. The semiconductor storage element according to claim 1, further comprising a first line disposed in the second direction, wherein the semiconductor layer is electrically connected to the first line.

5. The semiconductor storage element according to claim 1, wherein the first insulator contains silicon oxynitride, the second insulator contains silicon nitride, the third insulator contains silicon oxide, and the fourth insulator contains aluminum oxide.

6. A semiconductor storage element comprising:

a laminated body in which insulating layers and conductive layers are alternately laminated in a first direction;

a semiconductor layer disposed in the first direction in the laminated body;

a first insulator disposed in the first direction between the laminated body and the semiconductor layer;

a second insulator disposed in the first direction between the laminated body and the first insulator;

a third insulator disposed in the first direction between the laminated body and the second insulator; and a fourth insulator including a first part and a second part, the first part being disposed between each of the conductive layers and the third insulator, the second part being disposed in a second direction intersecting the first direction between each of the conductive layers and the insulating layer and connected to the first part, wherein the first part includes a High-k film, and a ratio of deuterium concentration to light hydrogen concentration in the High-k film is equal to or larger than 10.

* * * * *